(12) United States Patent
Kawashima et al.

(10) Patent No.: US 8,143,144 B2
(45) Date of Patent: Mar. 27, 2012

(54) SEMICONDUCTOR NANOWIRE AND ITS MANUFACTURING METHOD

(75) Inventors: Takahiro Kawashima, Osaka (JP); Tohru Saitoh, Osaka (JP)

(73) Assignee: Panasonic Corporation, Osaka (JP)

( * ) Notice: Subject to any disclaimer, the term of this patent is extended or adjusted under 35 U.S.C. 154(b) by 341 days.

(21) Appl. No.: 12/451,898

(22) PCT Filed: Jun. 4, 2008

(86) PCT No.: PCT/JP2008/001417
§ 371 (c)(1),
(2), (4) Date: Dec. 4, 2009

(87) PCT Pub. No.: WO2008/149548
PCT Pub. Date: Dec. 11, 2008

(65) Prior Publication Data
US 2010/0133509 A1    Jun. 3, 2010

(30) Foreign Application Priority Data
Jun. 6, 2007  (JP) ................................ 2007-150196

(51) Int. Cl.
*H01L 21/20* (2006.01)
*H01L 29/06* (2006.01)
(52) U.S. Cl. ........... 438/478; 438/493; 438/962; 257/14
(58) Field of Classification Search .................. 438/478, 438/479, 493, 962; 977/890, 891, 892; 257/12, 257/14, 15, 20, 24
See application file for complete search history.

(56) References Cited

U.S. PATENT DOCUMENTS

| | | | |
|---|---|---|---|
| 6,359,288 B1 * | 3/2002 | Ying et al. | 257/14 |
| 7,267,859 B1 * | 9/2007 | Rabin et al. | 428/131 |
| 2004/0157354 A1 | 8/2004 | Kuriyama et al. | |
| 2005/0253138 A1 * | 11/2005 | Choi et al. | 257/40 |
| 2006/0009003 A1 * | 1/2006 | Romano et al. | 438/382 |
| 2006/0207647 A1 | 9/2006 | Tsakalakos et al. | |
| 2006/0212975 A1 | 9/2006 | Choi et al. | |
| 2008/0224122 A1 | 9/2008 | Saitoh et al. | |

FOREIGN PATENT DOCUMENTS

| | | |
|---|---|---|
| JP | 45-004148 | 2/1970 |
| JP | 2004-193527 | 7/2004 |
| JP | 2004-535066 | 11/2004 |
| JP | 2005-194609 | 7/2005 |
| JP | 2006-248893 | 9/2006 |
| JP | 2006-261666 | 9/2006 |
| WO | 02/080280 | 10/2002 |

(Continued)

OTHER PUBLICATIONS

English language Abstract of JP 2004-193527, Jul. 8, 2004.

(Continued)

*Primary Examiner* — Kevin M Picardat
(74) *Attorney, Agent, or Firm* — Greenblum & Bernstein, P.L.C.

(57) ABSTRACT

A method for fabricating a semiconductor nanowire that has first and second regions is provided. A catalyst particle is put on a substrate. A first source gas is introduced, thereby growing the first region from the catalyst particle via a vapor-liquid-solid phase growth. A protective coating is formed on a sidewall of the first region, and a second source gas is introduced to grow the second region extending from the first region via the liquid-solid-phase growth.

18 Claims, 15 Drawing Sheets

FOREIGN PATENT DOCUMENTS

| | | |
|---|---|---|
| WO | 03/005450 | 1/2003 |
| WO | 2006/070670 | 7/2006 |

OTHER PUBLICATIONS

English language Abstract of JP 2004-535066, Nov. 18, 2004.
English language Abstract of JP 2005-194609, Jul. 21, 2005.
English language Abstract of JP 2006-248893, Sep. 21, 2006.
English language Abstract of JP 2006-261666, Sep. 28, 2006.
R. Martel et al., "Single- and multi-wall carbon nanotube field-effect transistors", Applied Physics Letters, Oct. 26, 1998, vol. 73 No. 17, pp. 2447-2449.
E. Tutuc et al., "Doping of Germanium nanowires grown in presence of PH3", Applied Physics Letters, 2006, vol. 89, p. 263-101.
Kawashima et al., "Raman Scattering Studies of Electrically Active Impurities in Situ B-Doped Silicon Nanowires: Effects of Annealing and Oxidation", 2007 American Chemistry Society Published on Web Oct. 3, 2007, pp. 15160-15165.
Kodambaka et al., "Control of Si Nanowire Growth by Oxygen", 2007 American Chemistry Society Published on Web May 9, 2006, Nano Letters 2006 vol. 6, No. 6, pp. 1292-1296.

* cited by examiner

FIG.14
(a)
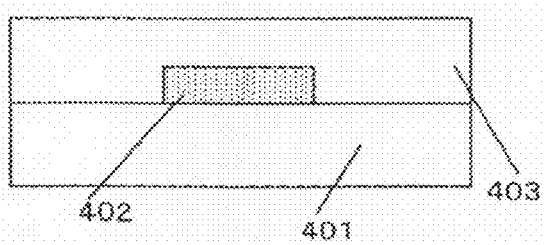
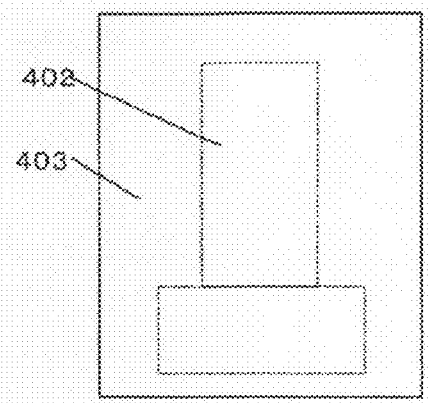
(b)
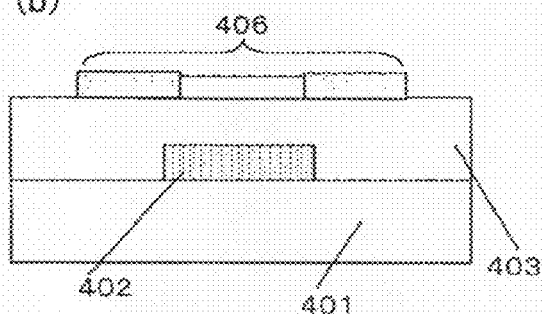
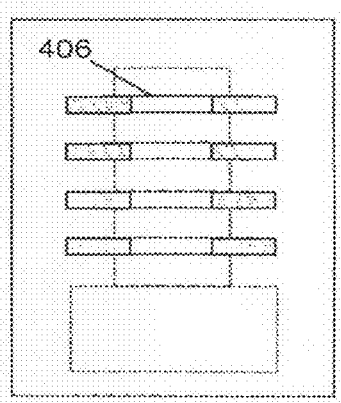
(c)
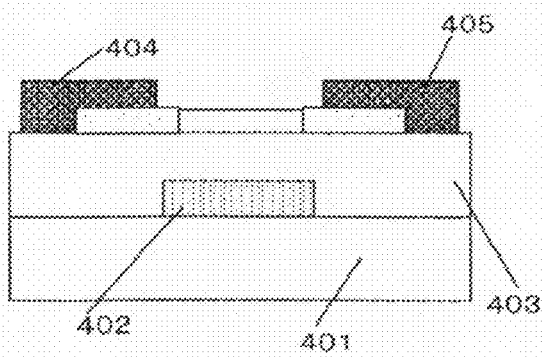
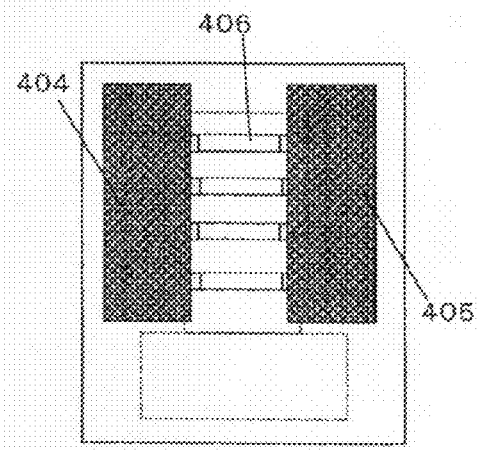

FIG.17
(a)
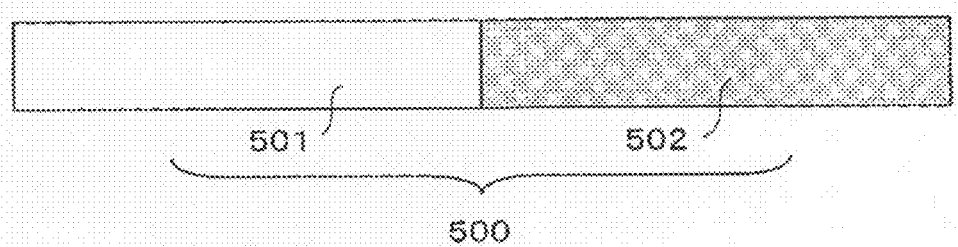
(b)
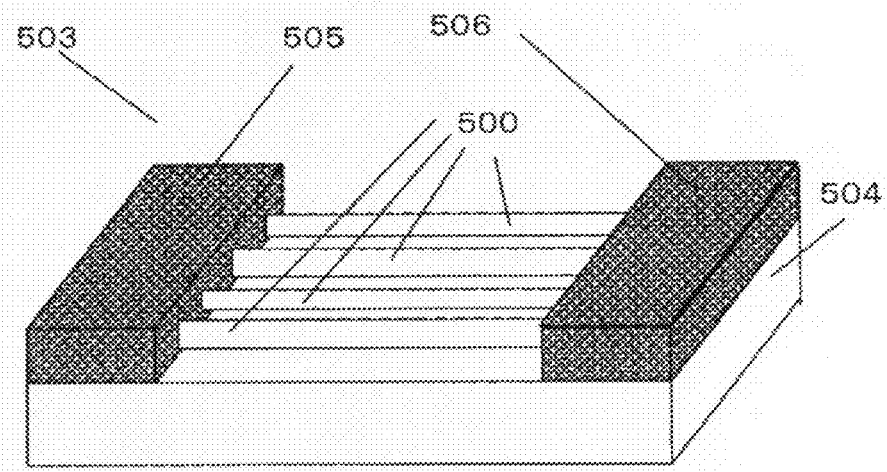

ary or etching technologies. For that reason, those nanostructures are expected to contribute to manufacturing high-performance devices at a reduced cost without resorting to those complicated process technologies.

SEMICONDUCTOR NANOWIRE AND ITS MANUFACTURING METHOD

TECHNICAL FIELD

The present invention relates to a semiconductor nanowire and a method for fabricating the same.

BACKGROUND ART

Researches and developments have been carried on extensively in order to reduce the feature sizes of transistors for large-scale integrated circuits (LSIs) or thin-film transistors (TFTs) for flat-panel displays. In a silicon semiconductor process, fine line patterning with a design rule of 0.1 µm or less is realized by shortening the wavelength of an exposing radiation source for use in a photolithographic process. However, according to the conventional photolithography technology, the feature size cannot be reduced unlimitedly. Also, as the feature size has been reduced, the costs of exposure systems and masking members have been rising steeply.

Meanwhile, carbon nanotubes (see Non-Patent Document No. 1) and nanowires made of a material with semiconductor type properties (see Patent Document No. 1) have attracted a lot of attention recently. Carbon nanotubes and nanowires are very small structures with a diameter of about 1 nm to about 100 nm and can be formed in a self-organizing manner. That is why with those carbon nanotubes or nanowires, a high-performance electronic device of a nanometer scale could be realized even without adopting those advanced photolithography or etching technologies. For that reason, those nanostructures are expected to contribute to manufacturing high-performance devices at a reduced cost without resorting to those complicated process technologies.

Hereinafter, a conventional method of growing nanowires will be described with reference to FIGS. 18(a) through 18(c). According to the process shown in FIGS. 18(a) through 18(c), nanowires 1004 made of a first material and nanowires 1005 made of a second material are grown in the growing axis direction. In this case, the first and second materials could be either mutually different materials or the same material including the same dopant in two different concentrations. Those nanowires can be grown by known vapor-liquid-solid phase (VLS) growth mechanism.

According to the conventional growing method, first, as shown in FIG. 18(a), catalyst particles 1001 are put on an arbitrary substrate 1002. The catalyst particles 1001 may be arranged by coating the substrate 1002 with a metal colloid solution by spin coating process or by depositing a metal thin film by sputtering process or evaporation process and then atomizing it into particles, for example.

Next, the substrate 1002 with those catalyst particles 1001 is loaded into the growth chamber of a CVD system, for example. As shown in FIG. 18(b), a source gas 1003, including a constituent element of the nanowires, is introduced into the chamber and maintained at predetermined temperature and pressure. In such an environment, the source gas 1003 selectively decomposes only in the vicinity of the catalyst particles 1001. Meanwhile, the catalyst particles 1001 react to this decomposed source gas, thereby making an alloy of the catalyst particles and the constituent element of the nanowires. The constituent element of the nanowires, which has been produced as a result of the decomposition of the source gas 1003, dissolves in the alloy of the catalyst particles and the constituent element of the nanowire to get the alloy supersaturated. Then, the constituent element of the nanowires precipitates out of the supersaturated alloy and then coagulates together, thereby growing a first type of nanowires 1004 made of the first material. By maintaining such a state for a predetermined amount of time, the nanowires can be grown to any desired length.

Next, as shown in FIG. 18(c), a second type of nanowires 1005 of the second material can be grown by changing the gases to introduce into the growth chamber.

As can be seen, according to the nanowire growing technology, the in-situ doping or hetero-epitaxy could be controlled on a nanometer scale as in a normal thin-film epitaxy process. Also, since the nanowires have a pseudo one-dimensional structure, the stress that has been caused due to a lattice constant misfit in the conventional thin-film deposition technology could be relaxed. Thus, it is expected that restrictions on the selection of materials would be removed by adopting such a technology.

Thus, nanowires that would contribute to forming a very small structure in a self-organizing manner or developing material engineering are one of the most prospective nanostructures.

Patent Document No. 1: PCT International Application Japanese National Phase Publication No. 2004-535066
Non-Patent Document No. 1: R. Martel, et. al., "Single- and Multi-wall Carbon Nanotube Field-Effect Transistors", Appl. Phys. Lett. 73, pp. 2447, 1998
Non-Patent Document No. 2: E. Tutuc, et al., "Doping of Germanium Nanowires Grown in Presence of PH3", Appl. Phys. Lett. 89, pp. 263101, 2006

DISCLOSURE OF INVENTION

Problems to be Solved by the Invention

It has been believed to be possible to grow two types of regions of different materials or with different conductivities in the growing axis direction by performing the manufacturing process described above. According to the recent report of Tutic, et al. (seem Non-Patent Document No. 2) and our researches, such a manufacturing process turned out to be difficult to carry out just as intended. To prove that, that manufacturing process will be described in further detail by way of an example in which Si nanowires (undoped) and then boron (B) doped Si nanowires (which will be referred to herein as "B—Si NWs") are grown.

First, as already described with reference to FIGS. 18(a) and 18(b), undoped Si nanowires 1004 are grown. Next, B—Si NWs 1005 are grown as already described with reference to FIG. 18(c). In this case, even if the source gases are simply changed, the nanowires consisting of doped and undoped portions as shown in FIG. 18(c) cannot be obtained. That is to say, even the undoped Si nanowires 1004 will also get doped while the B—Si NWs 1005 are being grown after that. This is probably because the dopant that has been introduced to form the B—Si NWs 1005 would promote not only the growth by the VLS growth mechanism described above but also the growth from the sidewall of the Si nanowires 1004. In this case, the solid solubility of Au, which is used as the catalyst particles 1001 in B, is so low in the nanowire growing temperature range of 300° to 600°, for example, that the solid solution of B would not be formed easily in droplets of Au. That is why Si nanowires with a high B concentration ($0.1 \times 10^{18}$ atoms/cm$^3$) would be difficult to grow by the VLS growth mechanism.

Likewise, even in multi-nanowires, if it is difficult for one of the constituent elements of the nanowires to form a solid solution with the catalyst particles, the growth would also occur from the sidewall of the nanowires.

As described above, if in a nanowire consisting of at least two different materials, the solid solubility of its constituent element in the catalyst particles to use is not sufficiently high (i.e., equal to or lower than the material's designed value), the problem described above will arise to make it difficult to control the structure of the nanowire.

Meanwhile, a method for controlling the structure of conventional nanowires, which are arranged on an arbitrary substrate, by a technique such as ion implantation has also been proposed. According to such a method, the precision would be determined by that of the photolithographic process to perform. Also, in that case, a heat treatment should be carried out to repair the damage that has been caused by ion bombardment or ion implantation. That is why some restriction would be imposed because the substrate that could not withstand the heat should not be used.

It is therefore an object of the present invention to provide nanowires, of which the regions with different materials or conductivities can be aligned in the growth axis direction by a process that can be carried out easily, and also provide a method for fabricating such nanowires.

Means for Solving the Problems

A semiconductor nanowire fabricating method according to the present invention is a method for fabricating a semiconductor nanowire that has first and second regions. The method includes the steps of: (A) putting a catalyst particle on a substrate; (B) growing the first region from the catalyst particle by VLS growth mechanism; (C) forming a protective coating on the sidewall of the first region; and (D) growing the second region over the first region by the VLS growth mechanism.

In one preferred embodiment, the conductivity type of the first region is one of N and P types and that of the second region is the other of N and P types.

In another preferred embodiment, the first and second regions have the same conductivity type and the second region has lower electrical conductivity than the first region.

In still another preferred embodiment, the catalyst particle is made of either a metal or an alloy of a metal and a semiconductor.

In yet another preferred embodiment, the second region is made of a semiconductor material doped with a dopant element.

In this particular preferred embodiment, at the growth temperature of the second region, the solid solubility of the dopant element with respect to the catalyst particle is $1 \times 10^{19}$ atoms/cm$^3$ or less.

In a specific preferred embodiment, the first and second regions are made of a semiconductor material that includes at least one element selected from the group consisting of Si, Ge and C.

In another preferred embodiment, the dopant element is at least one element selected from the group consisting of B, P, As and Sb.

In still another preferred embodiment, in the step (D), a constituent element of the second region diffuses through the protective coating but does not reach the first region.

In this particular preferred embodiment, the protective coating includes at least one film selected from the group consisting of a silicon dioxide film, a silicon oxynitride film and a silicon nitride film.

In yet another preferred embodiment, the bandgap of the first material is different from that of the second material.

In a specific preferred embodiment, the second material is made up of at least two different elements and at the growth temperature of the second region, the solid solubility of at least one constituent element of the second material with respect to the catalyst particle is $1 \times 10^{19}$ atoms/cm$^3$ or less.

In yet another preferred embodiment, the protective coating is formed by thermally oxidizing the first region.

A first type of semiconductor nanowire according to the present invention includes: a first region including a dopant in a concentration of at least $1 \times 10^{19}$ atoms/cm$^3$; a second region, which is arranged continuously with the first region in the longitudinal direction thereof and which includes either a dopant in a concentration of at most $1 \times 10^{18}$ atoms/cm$^3$ or no dopants at all; and a third region, which is arranged continuously with the second region in the longitudinal direction thereof and which includes a dopant in a concentration of at least $1 \times 10^{19}$ atoms/cm$^3$.

A semiconductor device according to the present invention includes the first type of semiconductor nanowire of the present invention and further includes: a source electrode, which is connected to the first region of the semiconductor nanowire; a drain electrode, which is connected to the third region of the semiconductor nanowire; a gate electrode, which is arranged so as to face the second region of the semiconductor nanowire; and a gate insulating film, which is arranged between the second region and the gate electrode.

A second type of semiconductor nanowire according to the present invention includes: a first region including a dopant; a second region, which has a lower dopant concentration than the first region and which is arranged continuously with the first region in the longitudinal direction thereof; a third region, which has a higher dopant concentration than the second region and which is arranged continuously with the second region in the longitudinal direction thereof; a first sidewall, which is arranged on the side surface of the first region and which includes a polycrystalline material; and a second sidewall, which is arranged on the side surface of the third region and which includes a polycrystalline material. There is no sidewall on the side surface of the second region.

In one preferred embodiment, the closer to the second region, the thicker or the thinner the first and second sidewalls get.

Another semiconductor device according to the present invention includes the second type of semiconductor nanowire of the present invention and further includes: a source electrode, which is connected to the first region of the semiconductor nanowire; a drain electrode, which is connected to the third region of the semiconductor nanowire; a gate electrode, which is arranged so as to face the second region of the semiconductor nanowire; and a gate insulating film, which is arranged between the second region and the gate electrode.

Effects of the Invention

According to the method of the present invention, a process step that can be carried out easily is added, thus making it possible to control the shape of the nanowire being formed at a nanometer scale in the growth axis direction.

In addition, if the nanowire fabricated by the method of the present invention is used, there is no need to perform a process step for controlling the structure (such as ion implantation) or its accompanying posterior processing (such as heat treatment). As a result, various restrictions that are ordinarily imposed on the material and size of the substrate can be removed.

On top of that, since the structure of a nanowire can be controlled easily, the present invention is expected to be applied to various functional electronic devices including transistors, memories, LEDs and laser diodes, and electronic appliances including at least one of them.

Figure 8:
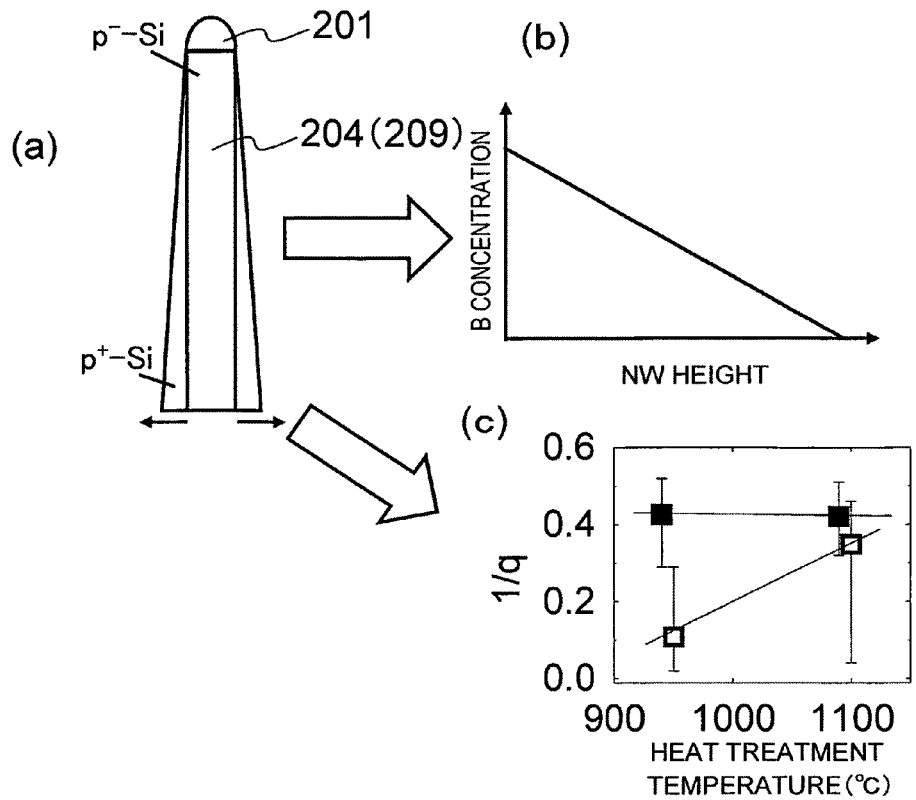

Portion (a) of FIG. 8 illustrates a Si nanowire on a larger scale, portion (b) of FIG. 8 is a graph schematically showing the distribution of B concentrations in a Si nanowire yet to be subjected to a heat treatment, and portion (c) of FIG. 8 is a graph showing relations between the temperature of a heat treatment that was carried out on the Si nanowires and the dopant concentration in the Si nanowires.

FIG. 9(a) illustrates a Si nanowire with a p-i structure, and FIGS. 9(b) and 9(c) are graphs showing the respective Raman spectra of the upper and lower portions of a B-doped Si nanowire.

Figure 10:
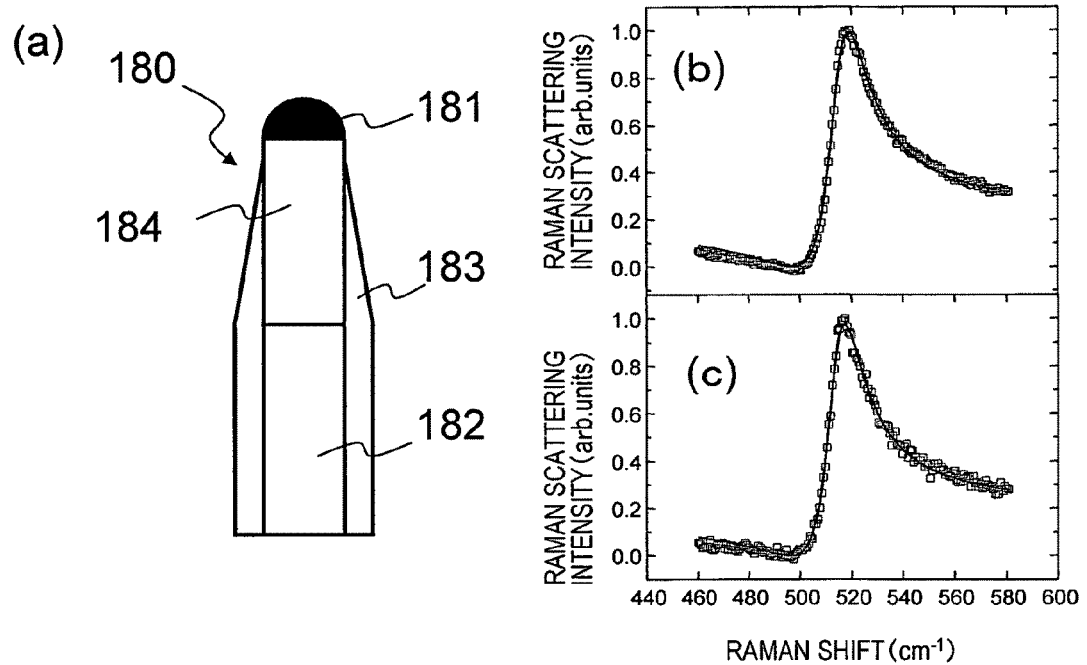

FIG. 10(a) illustrates a Si nanowire with an i-p structure, and FIGS. 10(b) and 10(c) are graphs showing the respective Raman spectra of the upper and lower portions of a non-doped Si nanowire.

FIGS. 11(a) through 11(d) illustrate a second preferred embodiment of a method for fabricating hetero nanowires according to the present invention.

Figure 12:
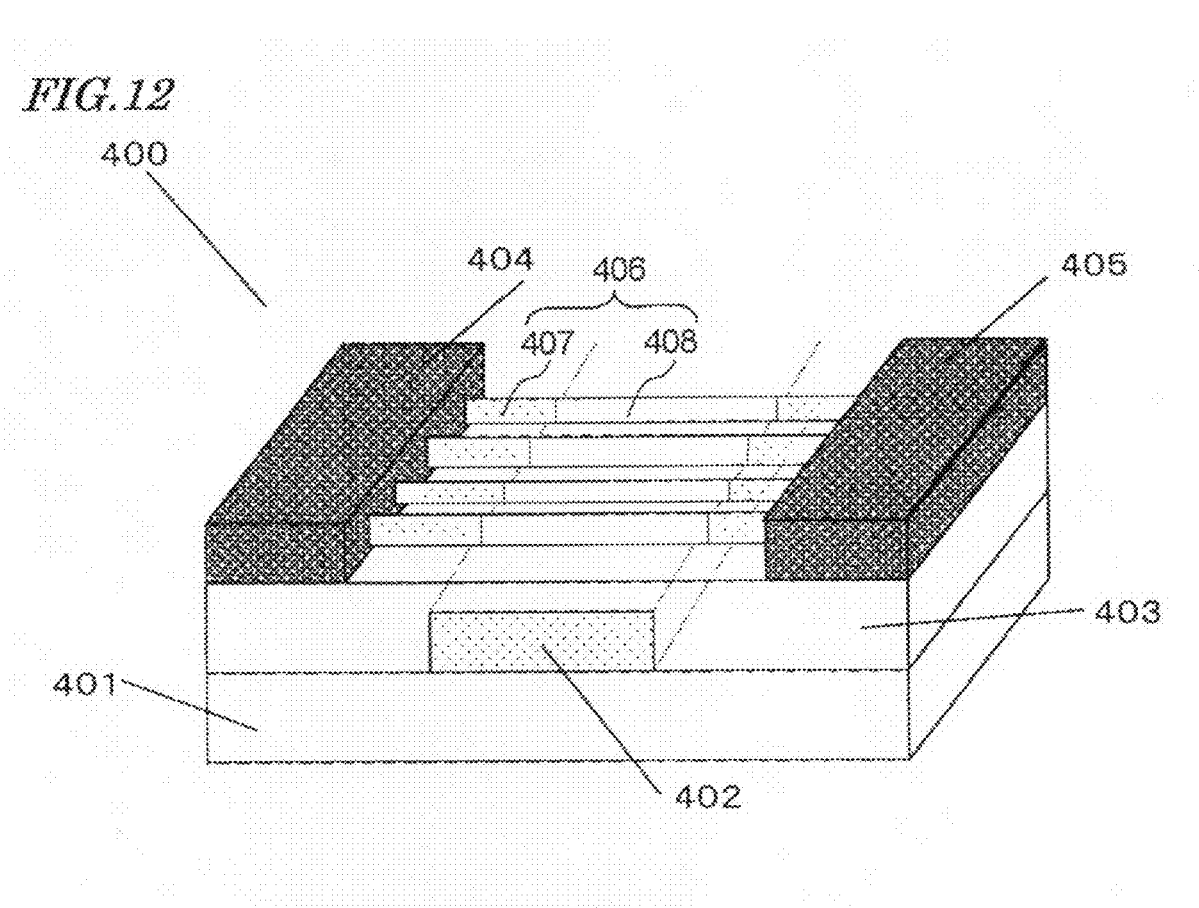

FIG. 12 is a perspective view illustrating a transistor as a third preferred embodiment of the present invention.

Figure 13:
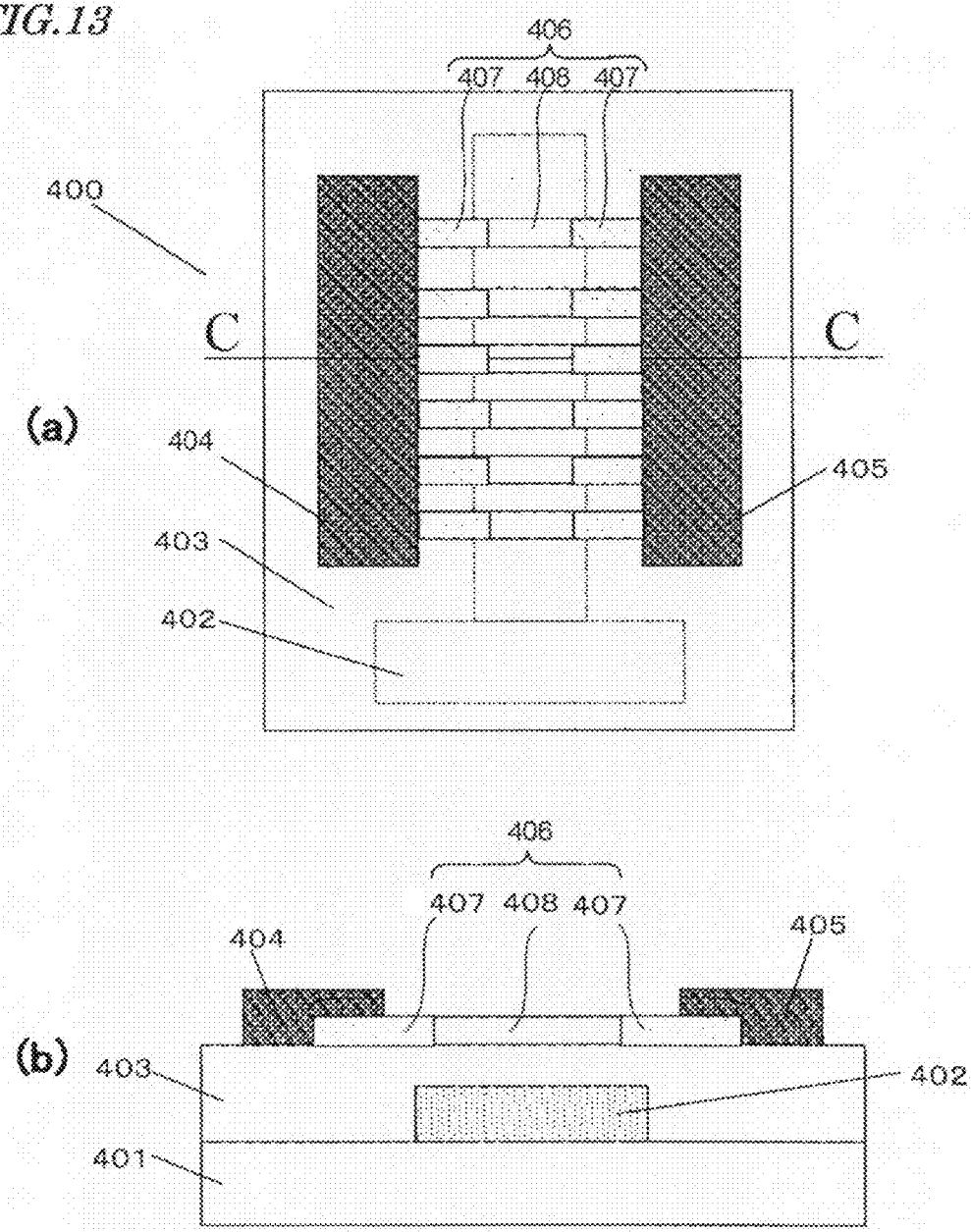

FIG. 13(a) is a top view of the nanowire transistor shown in FIG. 12 and FIG. 13(b) is a cross-sectional view as viewed on the plane C-C shown in FIG. 13(a).

FIGS. 14(a) through 14(c) illustrate an exemplary series of manufacturing process steps to fabricate the nanowire transistor of the third preferred embodiment.

Figure 15:
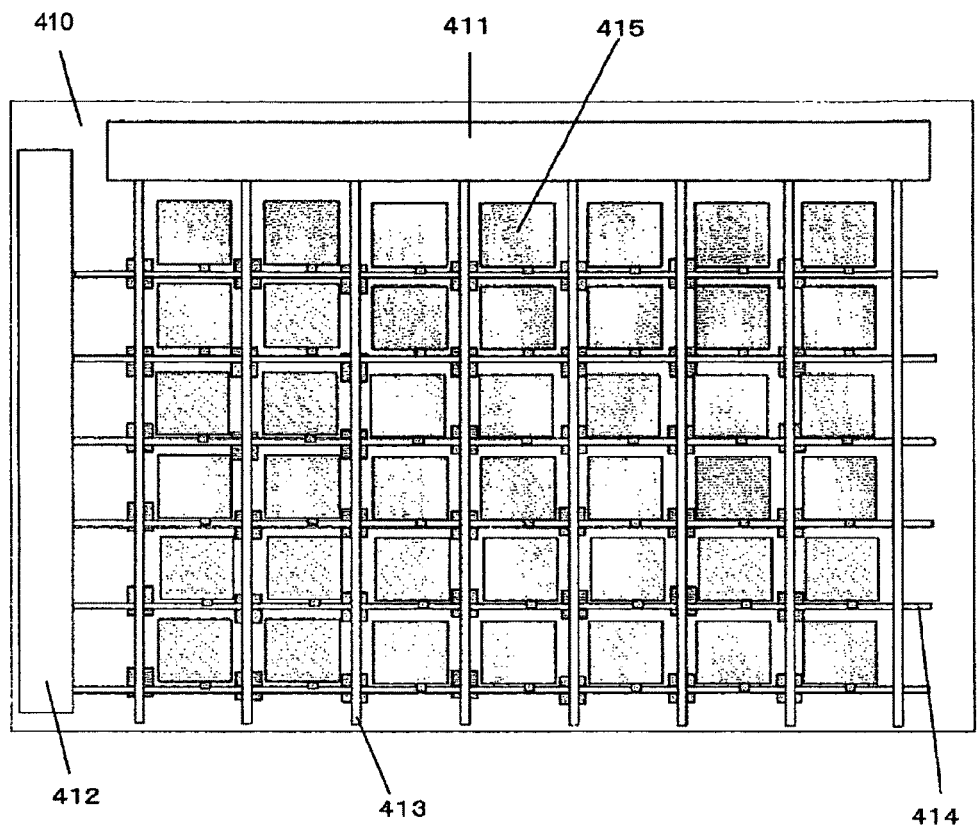

FIG. 15 schematically illustrates an organic EL display according to the third preferred embodiment.

Figure 16:
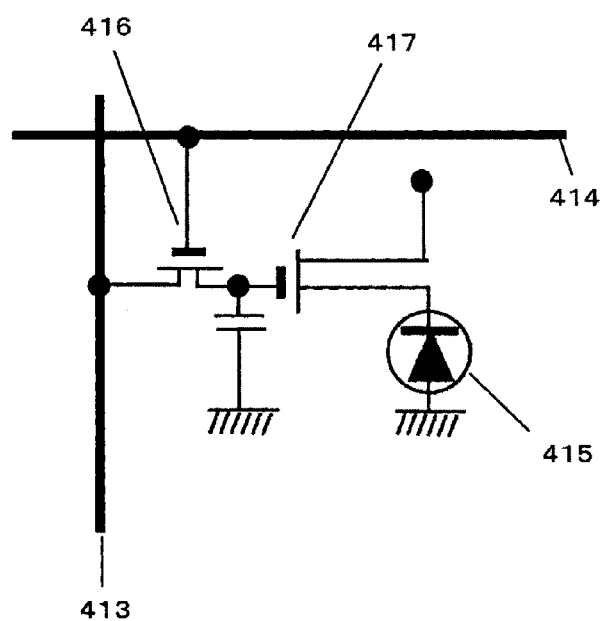

FIG. 16 illustrates a circuit to be arranged around each pixel of the organic EL display of the third preferred embodiment.

FIGS. 17(a) and 17(b) illustrate a nanowire light-emitting diode as a fourth preferred embodiment of the present invention.

Figure 18:
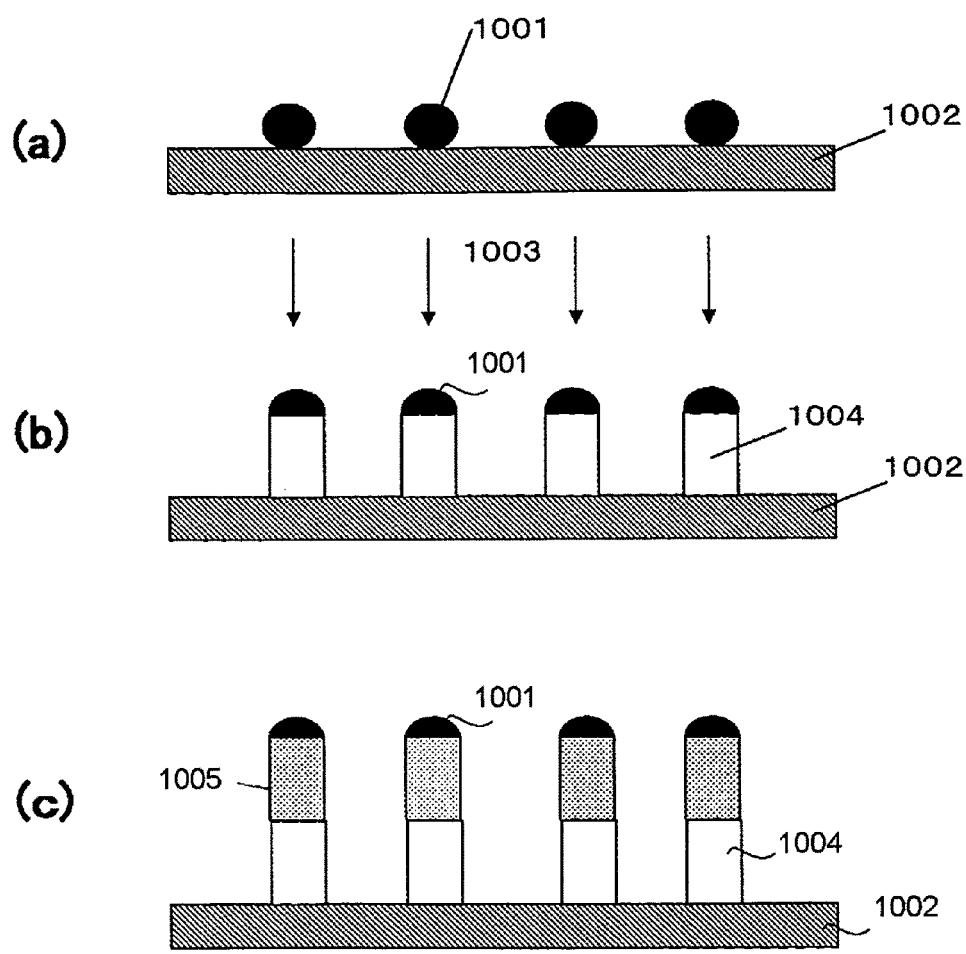

FIGS. 18(a) through 18(c) illustrate a conventional method for fabricating nanowires.

DESCRIPTION OF REFERENCE NUMERALS

| | |
|---|---|
| 101 | catalyst particle |
| 102 | substrate |
| 103 | source gas for first material |
| 104 | nanowire of first material |
| 105 | protective coating |
| 106 | nanowire of second material |
| 107 | source gas for second material |
| 170 | Si nanowire |
| 171 | Au particle |
| 172 | B-doped Si nanowire |
| 173 | sidewall |
| 174 | non-doped Si nanowire |
| 180 | Si nanowire |
| 181 | Au particle |
| 182 | non-doped Si nanowire |
| 183 | sidewall |
| 184 | B-doped Si nanowire |
| 201 | Au particle |
| 202 | silicon substrate |
| 203 | Si source gas, B source gas |
| 204 | B-doped Si nanowire |
| 205 | Si source gas |
| 206 | Si nanowire |
| 207 | Si nanowire |
| 208 | silicon dioxide film |
| 209 | Si nanowire |
| 210 | Si nanowire |
| 301 | Au particle |
| 302 | substrate |
| 303 | source gas for GaAs |
| 304 | GaAs nanowire |
| 305 | protective coating |
| 306 | GaAsP nanowire |
| 307 | source gas for GaAsP |
| 400 | nanowire transistor |
| 401 | substrate |
| 402 | gate electrode |
| 403 | gate insulating film |
| 404 | source electrode |
| 405 | drain electrode |
| 406 | p-i-p type Si nanowire |
| 407 | p-type doped region |
| 408 | non-doped region |
| 410 | flexible substrate |
| 411 | X driver |
| 412 | Y driver |
| 413 | X scan electrode |
| 414 | Y scan electrode |
| 415 | pixel |
| 416 | switching transistor |
| 417 | driver transistor |
| 500 | GaAs/GaAsP hetero nanowire |
| 501 | GaAs layer |
| 502 | GaAsP layer |
| 503 | nanowire light-emitting element |
| 504 | substrate |
| 505 | first electrode |
| 506 | second electrode |
| 1001 | catalyst particle |
| 1002 | substrate |
| 1003 | source gas |
| 1004 | nanowire of first material |
| 1005 | nanowire of second material |

BEST MODE FOR CARRYING OUT THE INVENTION

Hereinafter, preferred embodiments of a method for fabricating a semiconductor nanowire with a heterostructure (which will be referred to herein as a "hetero nanowire") according to the present invention will be described. A semiconductor nanowire as a preferred embodiment of the present invention has a structure in which a nanowire of a first material and a nanowire of a second material are connected together in the nanowire growing direction (i.e., the longitudinal direction thereof). It should be noted that the "first and second materials" do not always have to be made of semiconductor materials with mutually different compositions (or different bandgaps). Optionally, the first and second materials could be semiconductor materials that have the same composition but are doped with a dopant either in mutually different concentrations or of mutually opposite conductivity types. That is to say, the hetero nanowire of this preferred embodiment may consist of nanowires with mutually different compositions or nanowires made of a semiconductor materials having the same composition but doped with a dopant in mutually different concentrations or of mutually opposite conductivity types.

FIGS. 1(a) through 1(d) illustrate how to fabricate hetero nanowires as a preferred embodiment of the present invention. These nanowires can be grown by VLS growth mechanism, which is a known method.

Figure 1:
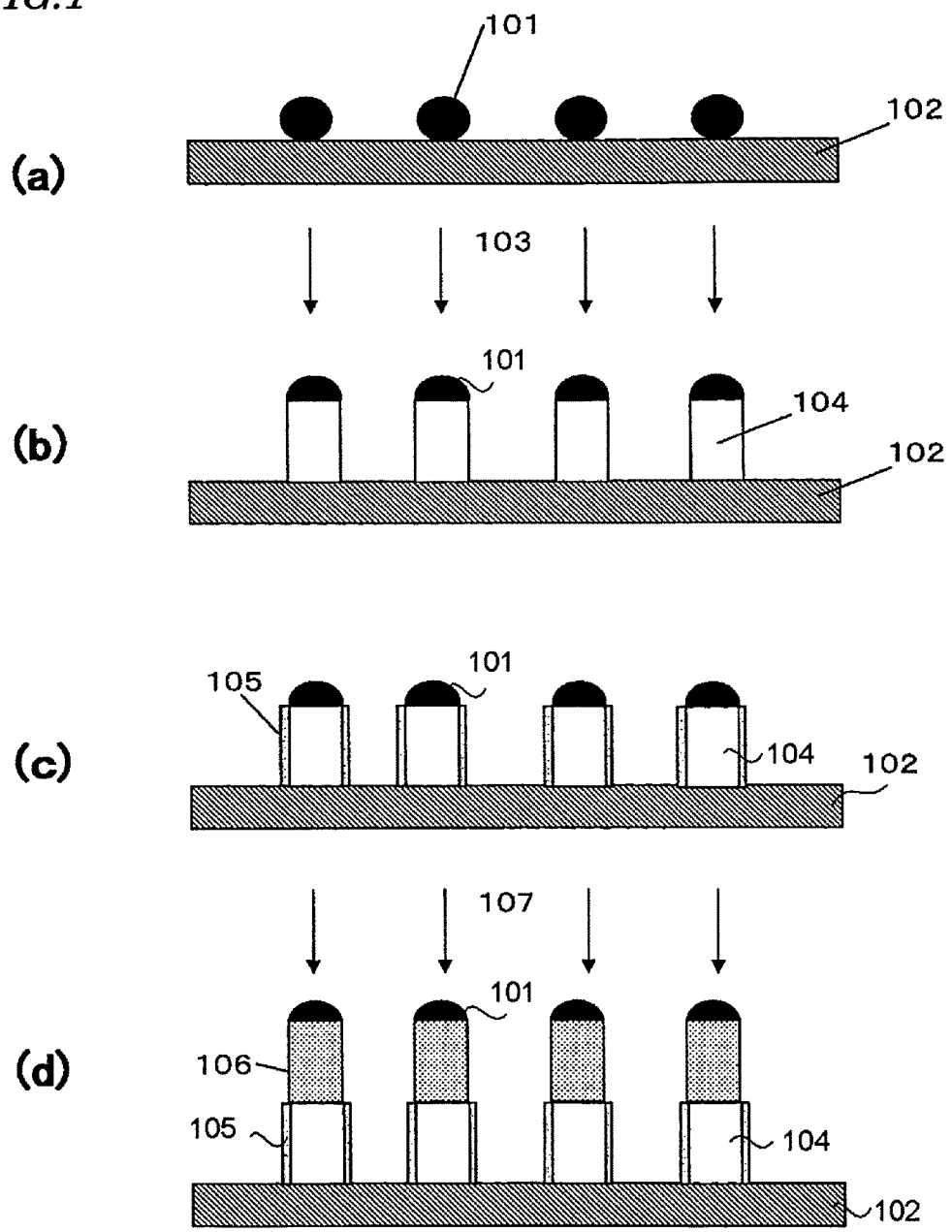
FIGS. 1(a) through 1(d) illustrate how to fabricate hetero nanowires according to a preferred embodiment of the present invention.
Figure 2:
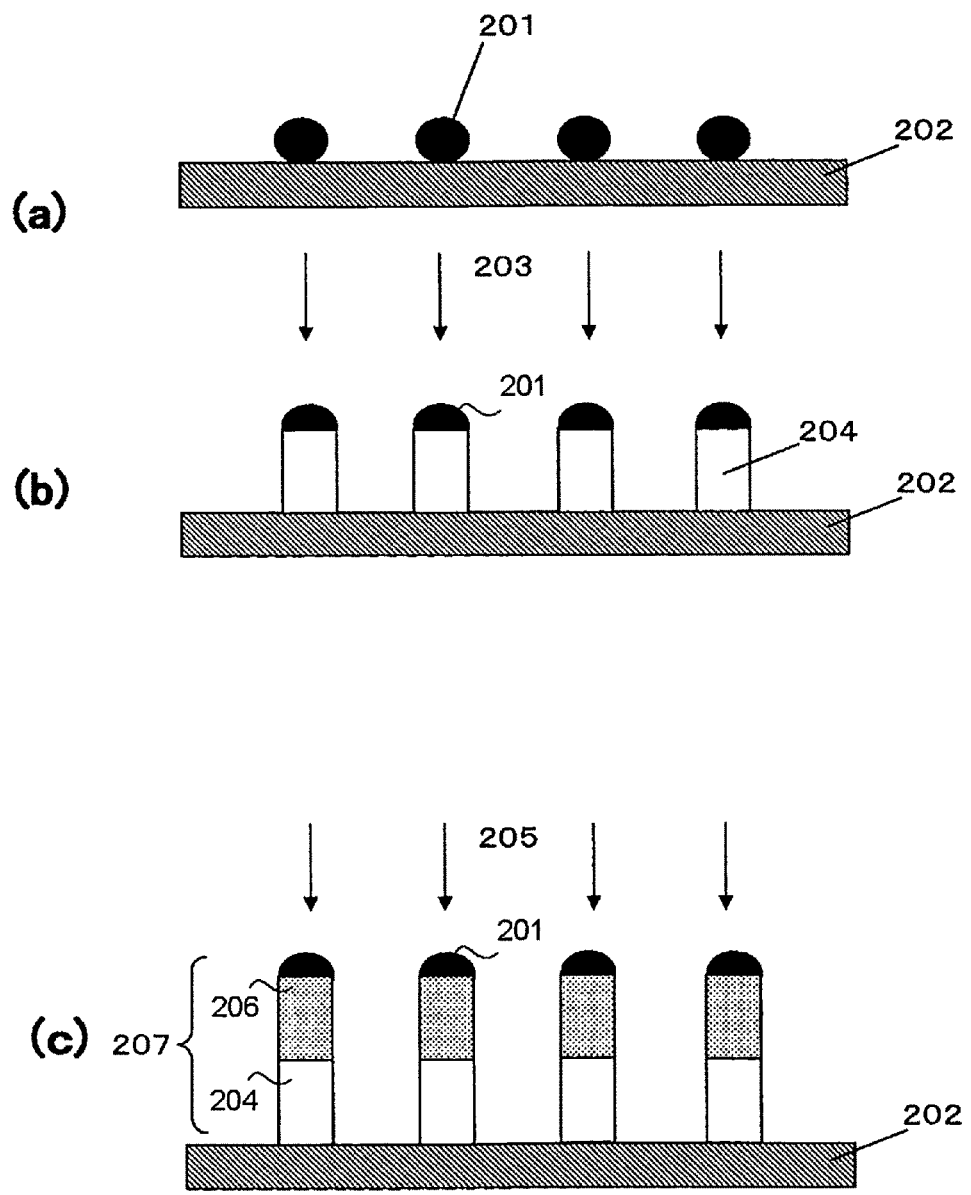
FIGS. 2(a) through 2(c) illustrate a first preferred embodiment of a method for fabricating hetero nanowires according to the present invention.
Figure 3:
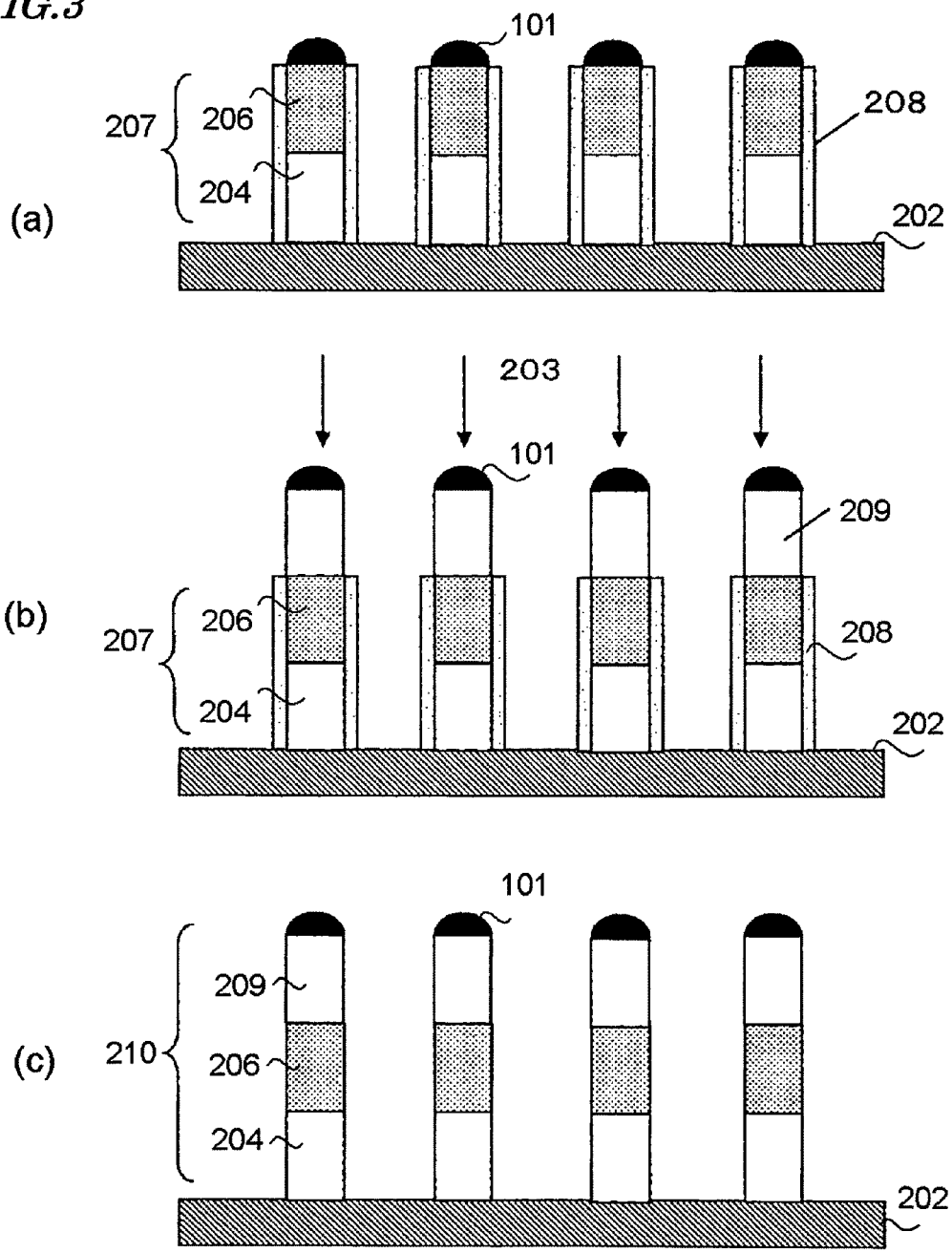
FIGS. 3(a) through 3(c) illustrate a first preferred embodiment of a method for fabricating hetero nanowires according to the present invention.

First, as shown in FIG. 1(a), catalyst particles 101 are put on an arbitrary substrate 102. The catalyst particles 101 may be arranged by coating the substrate 102 with a metal colloid solution by spin coating process or by depositing a metal thin film by sputtering process or evaporation process and then atomizing it into particles, for example. The catalyst particles 101 may be made of atoms of a metal such as gold, silver, copper, nickel, cobalt, iron or titanium, an alloy of the metal and a constituent material of the nanowire to be described later, or a composite material including any of the metals described above and a constituent material of the semiconductor layer. The catalyst particles 101 may have a particle size of approximately 1 nm to approximately 500 nm. In FIG. 1, spherical metal particles are illustrated. However, those metal particles do not always have to have such a circular cross section but may have also a quadrangular, hexagonal or any other polygonal cross section.

Next, the substrate 102 with these catalyst particles 101 is loaded into the chamber of a CVD system, for example. As shown in FIG. 1(b), a source gas 103, including a constituent element of the nanowires, is introduced into the chamber and maintained at a predetermined pressure. The substrate 102 is heated by a lamp or a heater, for example, and maintained at an arbitrary temperature. In such an environment, the source gas 103 of the first material selectively decomposes only in the vicinity of the catalyst particles 101. Meanwhile, the catalyst particles 101 react to this decomposed source gas, thereby making an alloy of the catalyst metal and the constituent element of the nanowires.

The constituent element of the nanowires dissolves in the alloy to get the alloy supersaturated. Then, the constituent element of the nanowires precipitates out of the alloy and then coagulates together, thereby growing nanowires 104 of the first material.

Next, as shown in FIG. 1(c), a protective coating 105 is formed on the sidewall of the nanowires 104 of the first material. The protective coating 105 may be formed by introducing a gas into the chamber and depositing a film or by performing a sputtering process or an evaporation process, for example. Also, the protective coating 105 is made of a material that would be etched away at three times or more as high an etch rate as the first and second materials that make the nanowires 104 and 106 (see FIG. 1(d)) when exposed to the same arbitrary etchant. Specifically, if the constituent element of the nanowires 104 of the first material is Si, the protective coating 105 may be made of a silicon dioxide film or a silicon nitride film.

Subsequently, as shown in FIG. 1(d), a source gas 107 of the second material, including the constituent element of the nanowires, is introduced into the chamber and maintained at a predetermined pressure and a predetermined temperature, thereby growing nanowires 106 of the second material. After that, the protective coating 105 is removed.

The nanowires 104 and 106 of the first and second materials may be made of a Group IV semiconductor such as Si, Ge or SiGe, a Group III-V semiconductor such as GaAs, InP or InAs, or a Group II-VI semiconductor such as ZnS, ZnSe or CdS.

The nanowires 104 and 106 of the first and second materials may have a length of approximately 1 μm to approximately 100 μm and a diameter of approximately 2 nm to approximately 1 μm, for example.

According to the method for fabricating a nanowire of the present invention, while nanowires of the second material are growing, the sidewall of nanowires of the first material is covered with the protective coating. That is why the deposited material never grows directly on the sidewall of the nanowires of the first material. Also, the material of the protective coating may be determined so that the material deposited on the protective coating will never grow while the nanowires of the second material are growing. And the protective coating is preferably thick enough to prevent the constituent element of the nanowires of the second material from diffusing through the protective coating to reach the surface of the nanowires of the first material while the nanowires of the second material are growing. Detailed growth conditions will be described later.

Hereinafter, specific preferred embodiments of the present invention will be described.

Embodiment 1

A first specific preferred embodiment of a semiconductor nanowire manufacturing process according to the present invention will be described with reference to FIGS. 2(a) through 3(c). In this preferred embodiment, Si nanowires that have been doped to have a p-i-p structure are formed.

First, as shown in FIG. 2(a), a silicon substrate 202 is provided as a growth substrate and catalyst particles 201 of gold (Au) are put on the silicon substrate 202. The silicon substrate 202 just needs to have thermal resistance that is high enough to withstand the heat treatment temperature on the nanowires growing. That is why a silicon dioxide film or a silicon nitride film may have been deposited on the silicon substrate 202. The crystallographic plane orientation and resistivity of the silicon substrate 202 may be determined arbitrarily.

The Au particles 201 used as the catalyst particles have distinct ability to promote the decomposition of the source gas and are used to produce a eutectic with the constituent element of the nanowires and encourage the growth of the nanowires. The diameter of the Au particles 201 becomes almost equal to that of the nanowires. That is why the diameter of the Au particles 201 needs to be defined so as to obtain a nanowire with a desired diameter. The Au particles 201 normally have a diameter of 1 nm to 1,000 nm, and preferably have a diameter of 5 nm to 100 nm.

The Au particles 201 may be formed on the silicon substrate 202 by a known method. For example, a thin film of Au may be deposited on the surface of the silicon substrate 202 by sputtering process or evaporation process in any known thin film deposition system and then thermally treated so as to coagulate by itself. In this manner, Au particles 201 can be formed as shown in FIG. 2(a).

In this preferred embodiment, the Au particles 201 may be formed by depositing a thin film of Au to a thickness of about 0.5 nm to about 10 nm by EB evaporation process and then thermally treating the film at 500° for approximately 30 minutes to approximately three hours. The diameter of the Au particles 201 changes with the thickness of the Au thin film and the heat treatment conditions. For that reason, the thickness of the Au thin film needs to be adjusted such that the Au particles 201 have a desired diameter. In this preferred embodiment, a thin film of Au is deposited to a thickness of about 2 nm and then thermally treated at 500° for 30 minutes within a vacuum.

Thereafter, the silicon substrate 202 on which the Au particles 201 have been formed is loaded into the chamber of a CVD system, for example. Next, as shown in FIG. 2(b), a source gas 203 including element Si and element B is supplied into the chamber and maintained at a predetermined pressure and a predetermined temperature. As a result, the element Si in the source gas 203 that has been decomposed on the surface of the Au particles 201 reacts to the Au particles 201 on the silicon substrate 202 to make an Au—Si alloy there. The element Si dissolves in the alloy to get the alloy supersaturated. Then, Si precipitates out of the supersaturated alloy and then coagulates together, thereby growing Si nanowires 204.

Figure 4:
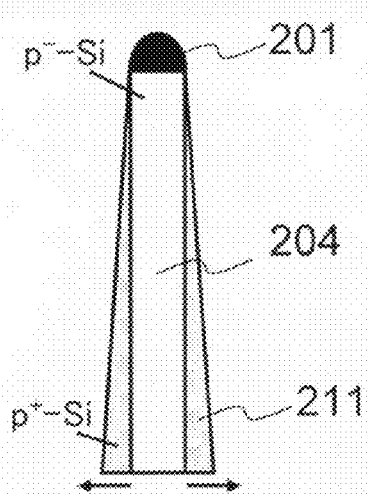
FIG. 4 illustrates, on a larger scale, a Si nanowire 204 that has been grown while being doped with B in-situ.

FIG. 4 illustrates, on a larger scale, a Si nanowire 204 that has been grown while being doped with B in-situ. When Si gets supersaturated inside the Au particle 201, the Si nanowire 204 grows (by VLS mechanism). On the other hand, at the growth temperature of the Si nanowire 204 (which may be in the range of approximately 300° through approximately 600°), the solid solubility of B with respect to Au is very low (i.e., B hardly dissolves in Au). For that reason, it is difficult to introduce B in a concentration of at least $1 \times 10^{19}$ atoms/cm$^3$ (that is the minimum required dopant concentration at or over which the Si nanowire 204 can make a good ohmic contact with the electrode) into the Si nanowire 204 even by VLS mechanism.

Meanwhile, if there was a lot of B, then the activation energy to grow a polycrystalline or crystalline Si film would decrease. That is why if B and Si are supplied onto the sidewall of the Si nanowires 104, a polycrystalline film of Si, including B, will grow to form a sidewall 211 there. The thickness of the sidewall 211 increases proportionally to the growing process time. That is why the more distant from the Au particle 201, the thicker the sidewall 211 will get. As a result, the sidewall 211 comes to have a tapered cross section.

Figure 5:
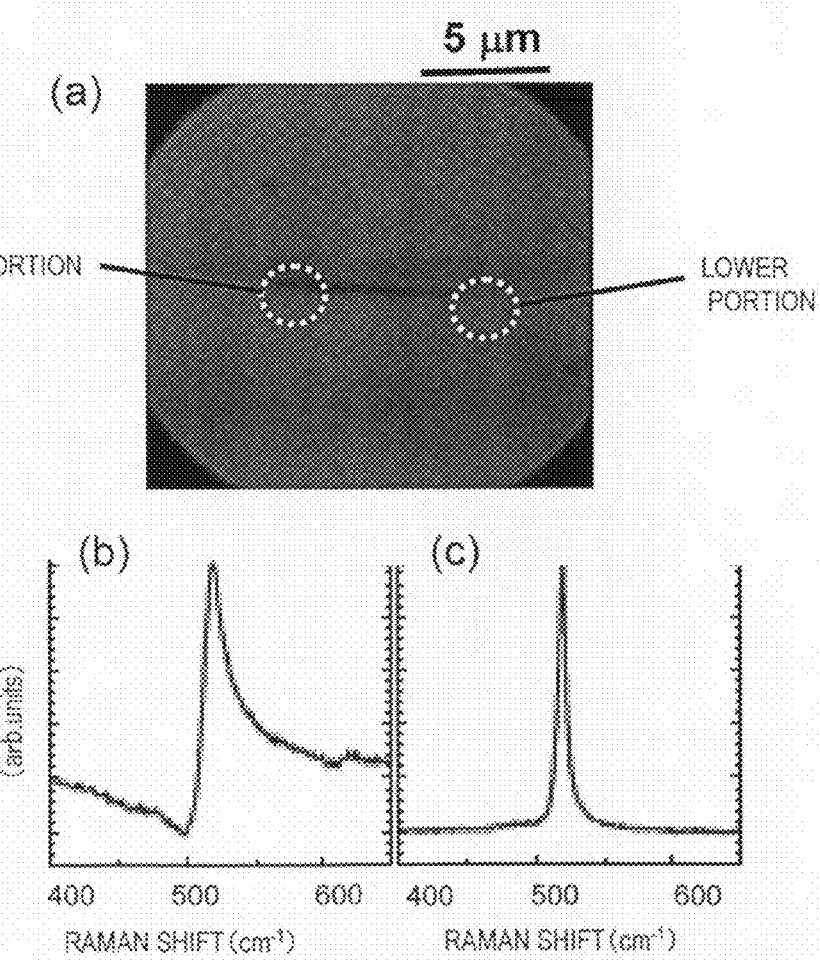
FIG. 5(a) is an optical micrograph representing an image of a Si nanowire.
FIGS. 5(b) and 5(c) are graphs showing the Raman spectra of the lower and upper portions of the Si nanowire (i.e., the portions that are away from, and in contact with, the Au particle, respectively).

FIG. 5(a) is a micrograph representing an image of a Si nanowire, while FIGS. 5(b) and 5(c) show the Raman spectra of the lower and upper portions of the Si nanowire (i.e., the portions that are away from, and in contact with, the Au particle, respectively). The peak observed in the vicinity of 520 cm$^{-1}$ shown in FIGS. 5(b) and 5(c) represents an optical phonon that would have been produced by the vibrations of a pair of adjacent Si atoms. Comparing the Si—Si mode peaks shown in FIGS. 5(b) and 5(c) to each other, it can be seen that the peak shown in FIG. 5(c) has a symmetric shape (i.e., a Lorentz function) but the one shown in FIG. 5(b) has an asymmetric shape that leaves a tail on the higher frequency side. Such a variation in shape would have been caused due to the resonance reaction between the phonon Raman scattering and the electron Raman scattering. Such a phenomenon is called a "Fano resonance". If the Fano resonance was observed on the B—Si NW, then it means that electrically active B atoms (at the lattice site of Si) would have been there. Thus, these results reveal that during the growth of a heavily B-doped Si NW by VLS mechanism, the lower portion of the Si nanowire had certainly been doped with B but the upper portion thereof had not been doped with B to a level sensible in the Raman spectrum.

Figure 6:
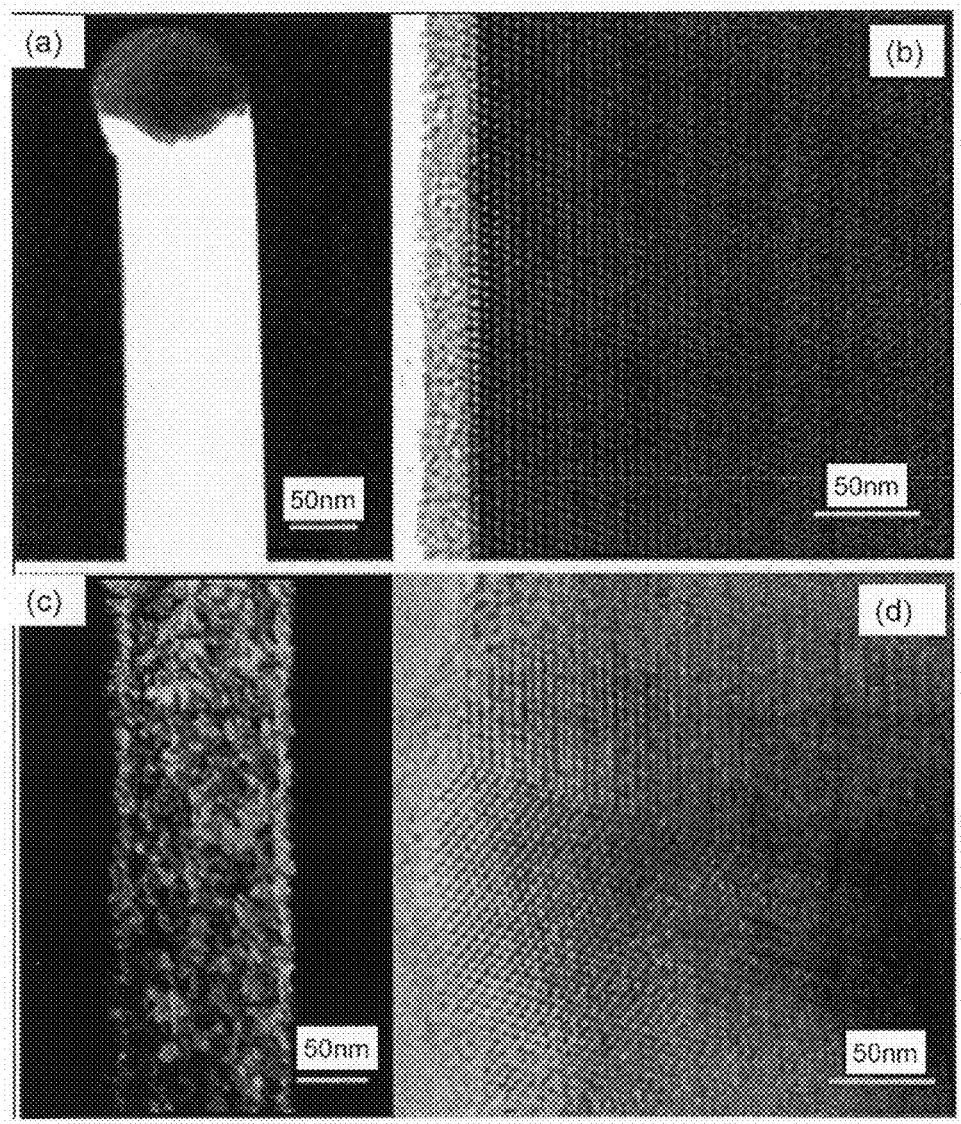
FIGS. 6(a) and 6(b) are respectively a dark field TEM (transmission electron microscope) photograph and a high-resolution TEM photograph representing the upper portion of a Si nanowire. On the other hand.
FIGS. 6(c) and 6(d) are respectively a dark field TEM photograph and a high-resolution TEM photograph representing the lower portion of the Si nanowire.

FIGS. 6(a) and 6(b) are respectively a dark field TEM (transmission electron microscope) photograph and a high-resolution TEM photograph representing the upper portion of a Si nanowire. On the other hand, FIGS. 6(c) and 6(d) are respectively a dark field TEM photograph and a high-resolution TEM photograph representing the lower portion of the Si nanowire. As can be seen from FIGS. 6(a) and 6(c), there was no contrast difference on the surface of the upper portion of the Si nanowire but was a significant contrast difference on the surface of the lower portion of the Si nanowire. When these dark field TEM photos were shot, the contrast was set on a certain crystallographic orientation. That is why a difference in contrast corresponds to a difference in crystallographic orientation. As also can be seen from FIGS. 6(b) and 6(d), the upper portion of the Si nanowire was single crystalline but the lower portion thereof was polycrystalline. Thus, these results reveal that a thicker sidewall had been formed as a polycrystalline film on the lower portion of the Si nanowire.

As the source gas for forming the Si nanowires 204, SiB$_4$, Si$_2$H$_6$, Si$_3$H$_8$, SiH$_2$Cl$_2$ or SiCl$_4$ may be used, for example. According to this preferred embodiment, the nanowires may be grown using an ultrahigh vacuum CVD system, setting the substrate at a temperature of 350° to 500°, using Si$_2$H$_6$ gas as the source gas for silicon and B$_2$H$_6$ gas as the source gas for boron, and adjusting the in-chamber pressure within the range of 10$^{-2}$ Torr to 10 Torr.

Figure 7:
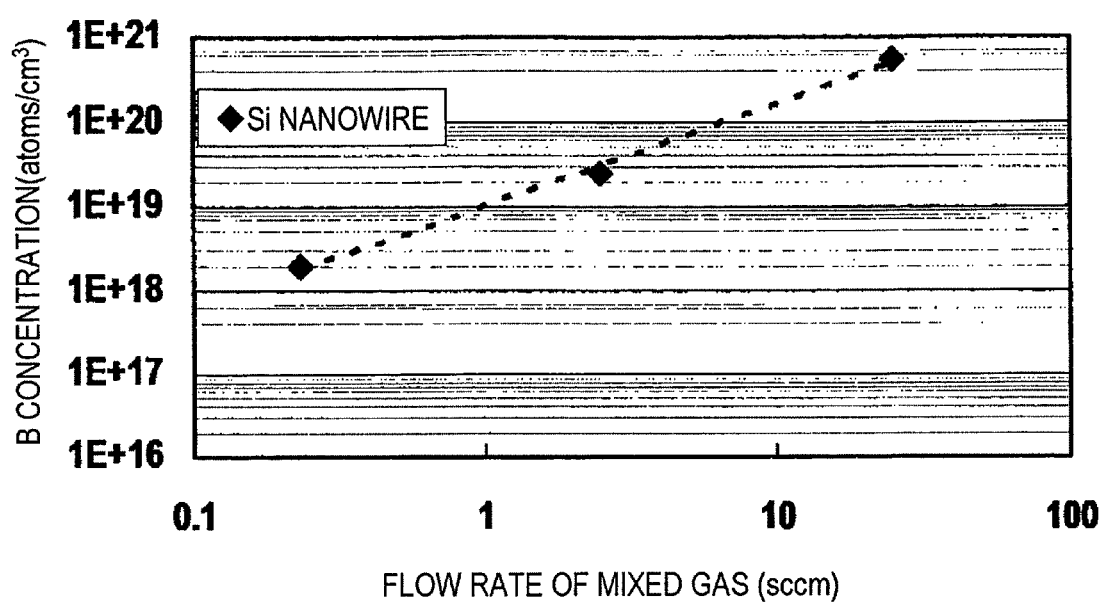
FIG. 7 is a graph showing how the dopant concentration in a Si nanowire changes with the flow rate of $B_2H_6$ gas.

The dopant concentration in the Si nanowire 204 can be controlled by adjusting the flow rate of the B$_2$H$_6$ gas. FIG. 7 shows the dependence of the B concentration in the Si nanowire on the flow rate of B$_2$H$_6$ gas. In FIG. 7, the abscissa represents the flow rate of a mixture of the B$_2$H$_6$ gas and H$_2$ gas. Specifically, the B$_2$H$_6$ gas accounts for 5% of this mixture. On the other hand, the ordinate represents the average B concentration of a certain number of Si nanowires that had been analyzed by SIMS. Just like the conventional epitaxy, the B concentration can be controlled in a broad range by adjusting the flow rate of the B$_2$H$_6$ gas.

Next, as shown in FIG. 2(c), undoped Si nanowires 206 are grown by changing the nanowire source gases 205. The Si nanowires 206 are preferably grown under the conditions described above. As a result, Si nanowires 207 with a p-i-p structure, each consisting of the B-doped Si nanowire 204 and the undoped Si nanowire 206, are formed.

Subsequently, as shown in FIG. 3(a), a protective coating 208 of silicon dioxide is formed on the sidewall of the Si nanowires 207. The protective coating 208 may be formed by introducing either oxygen gas or oxygen and hydrogen gases for a predetermined amount of time with the substrate maintained at a temperature of 300° to 1,000°, for example. In this case, either a silicon nitride film or a silicon oxynitride film may be formed by introducing a nitrogen containing gas such as ammonium gas or nitrogen monoxide gas. Alternatively, a protective coating 208 of silicon dioxide or silicon nitride may also be formed by CVD process.

Thereafter, as shown in FIG. 3(b), B-doped Si nanowires 209 are grown by the method described above. In this process step, the sidewall of the Si nanowires 207 with the p-i structure is covered with the protective coating 208, and therefore, the B-containing Si film is not deposited on the sidewall of the Si nanowires 207. Thus, it is possible to prevent the Si nanowires 207 with the p-i structure from being doped with B automatically. If the protective coating 208 is made of silicon dioxide, a B-doped Si film (not shown) is deposited on the silicon dioxide film. In the growth temperature range, however, B has a very short diffusion length into Si and silicon dioxide films and rarely reaches the sidewall of the Si nanowires 207 with the p-i structure. Also, since B included in Si is likely to precipitate in the silicon dioxide film, B hardly diffuses toward the sidewall of the Si nanowires 207.

As a result, the B-doped Si nanowires 204 and 209 can be doped heavily to $1\times10^{19}$ atoms/cm³ or more, while the dopant concentration in the non-doped Si nanowires 207 can be reduced to $1\times10^{18}$ atoms/cm³ or less.

Although not shown, the side surface of the B-doped Si nanowires 204 and 209 in the Si nanowires 210 shown in FIG. 3(c) is actually covered with a sidewall, of which the thickness increases as the point of measurement goes farther away from the Au particle 201. On the other hand, the side surface of the non-doped Si nanowires 207 in the Si nanowires 210 is not covered with any sidewall.

Then, as shown in FIG. 3(c), the protective coating 208 and what has been deposited on the protective coating 208 (not shown) are removed, thereby completing Si nanowires 210 with the p-i-p structure. The protective coating 208 may be removed by immersing the nanowires in a hydrofluoric acid solution.

Thereafter, the Si nanowires 210 are subjected to a heat treatment at a temperature of 1,100° or more. The heat treatment may be carried out either by heating the nanowires instantaneously a number of times or by keeping them heated to a certain temperature for about 10 seconds to about 5 minutes. The heat treatment may be conducted in an inert atmosphere such as nitrogen gas, in an oxygen atmosphere, or even in the air. That is to say, any atmosphere may be used to carry out the heat treatment. Also, either a laser annealing process or a lamp annealing process will do. In any case, the heat treatment is preferably carried out at a temperature of 1,200° or less, considering the melting point of the nanowires.

Next, it will be described what effects will be achieved by conducting this heat treatment.

Portion (a) of FIG. 8 illustrates a Si nanowire on a larger scale. Specifically, the Si nanowire shown in portion (a) of FIG. 8 is a p-region of the Si nanowire 210 with the p-i-p structure, i.e., either the Si nanowire 204 or the Si nanowire 209. On the other hand, portion (b) of FIG. 8 shows the distribution of B concentrations in the Si nanowire yet to be subjected to the heat treatment. As can be seen from portion (b) of FIG. 8, the more distant from the Au particle 201, the higher the B concentration.

Portion (c) of FIG. 8 shows relations between the temperature of a heat treatment that was carried out on the Si nanowires and the dopant concentration in the Si nanowires. In portion (c) of FIG. 8, the ordinate represents the bond strength (1/q). The greater this value, the higher the concentration of the dopant included in the Si nanowires would be. Also, in portion (c) of FIG. 8, the solid square ∎ plots a value that was measured at the lower end of the Si nanowires, while the open square ☐ plots a value that was measured at the upper end of the Si nanowires. As shown in portion (c) of FIG. 8, when the heat treatment was conducted at 900°, the dopant concentrations at the upper and lower ends of the Si nanowires were quite different from each other. However, the higher the heat treatment temperature, the narrower the difference between the dopant concentrations. And when the heat treatment was carried out at 1,100°, the difference in dopant concentration between the upper and lower ends decreased to almost a tolerance level. These results reveal that if the heat treatment is carried out at a temperature of 1,100° or more, the distribution of the dopant in the Si nanowires can be uniform.

Figure 9:
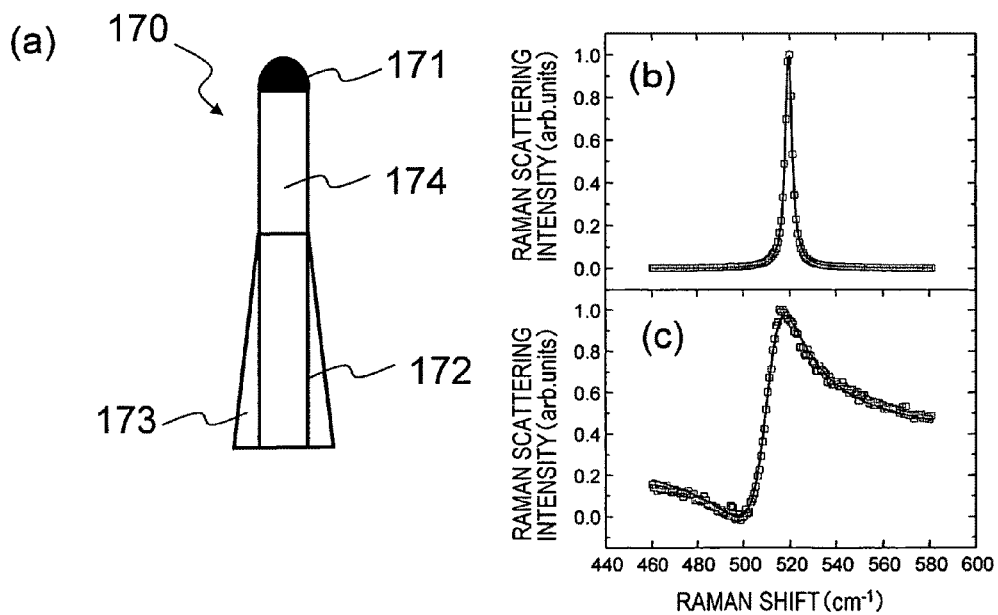

The present inventors also measured the Raman spectra of Si nanowires that had been formed without being covered with the protective coating 208. FIG. 9(a) illustrates a Si nanowire 170 with a p-i structure. The Si nanowire 170 includes an Au particle 171, a non-doped Si nanowire 174 located under the Au particle 171, a B-doped Si nanowire 172 located under the non-doped Si nanowire 174, and a sidewall 173 on the side surface of the B-doped Si nanowire 172. Since the non-doped Si nanowire 174 is formed after the B-doped Si nanowire 172 has been formed, the sidewall 173 covers only the side surface of the B-doped Si nanowire 172. FIGS. 9(b) and 9(c) are graphs showing the respective Raman spectra of the upper and lower portions of the B-doped Si nanowire 172. As can be seen, the optical phonon peak is symmetric in FIG. 9(b) but asymmetric in FIG. 9(c). This means that the lower portion of the Si NW was doped with B more heavily than the upper portion thereof. That is to say, the Si NW shown in FIG. 9 has the p-i structure.

FIG. 10(a) illustrates a Si nanowire 180 with an i-p structure. The Si nanowire 180 includes an Au particle 181, a B-doped Si nanowire 184 located under the Au particle 181, a non-doped Si nanowire 182 located under the B-doped Si nanowire 184, and a sidewall 183 that covers the side surface of the non-doped Si nanowire 182 and the B-doped Si nanowire 184. Since the B-doped Si nanowire 184 is formed after the non-doped Si nanowire 182 has been formed, the side surface of the non-doped Si nanowire 182 is covered with the sidewall 183 with substantially a uniform thickness but that of the B-doped Si nanowire 184 is covered with the sidewall 183, of which the thickness decreases upward. FIGS. 10(b) and 10(c) are graphs showing the respective Raman spectra of the upper and lower portions of the non-doped Si nanowire 182. As the peaks shown in FIGS. 10(b) and 10(c) are both asymmetric, it can be seen that the non-doped Si NW got doped with B anyway, although no dopant gas had been supplied while the Si NW was growing. These results reveal that the thickness of the sidewall increases proportionally to the amount of time for which the nanowire has been exposed to the atmosphere including the B source gas.

The material of the catalyst particle is preferably selected so that the solid solubility of dopant atoms in the growth temperature range becomes smaller than the target dopant concentration by at least one digit. For example, if the dopant is B or P and if the growth temperature is equal to or lower than 1,000°, solid solution will not be produced easily with any of the metals, and therefore, the effect of the present invention can be achieved, no matter which metal is used as the catalyst. On the other hand, if the dopant is arsenic, the effect of the present invention can be achieved unless the metal is silver, aluminum, gold, iron, gallium, indium or nickel.

In the process step shown in FIG. 3(b), while the B-doped Si nanowire 209 is being grown, the dopant should not pass through the protective coating 208 to reach the Si nanowire 207. From this point of view, the thickness of the protective coating 208 is preferably determined to be greater than the distance that the dopant diffusing can reach in the protective coating 208. For example, the protective coating 208 may have a thickness of 5 nm or more. Also, the material of the protective coating 208 is preferably selected to let the dopant diffuse at as small a diffusion coefficient as possible. For instance, the protective coating 208 is preferably made of silicon dioxide. Furthermore, the material of the protective coating 208 is preferably etched away in at least three times as high an etch rate as the material of the Si nanowire 207 when exposed to the same arbitrary etchant. To realize that, the material of the protective coating 208 is preferably Ge, hafnium oxide or GaAs, for example.

As described above, according to the manufacturing process of this preferred embodiment, a region with a relatively high dopant concentration and a region with a relatively low dopant concentration can be defined sharply by adding a process step that can be carried out easily. Consequently, nanowires with enhanced performance can be provided and should be applicable to various electronic devices including transistors, memories and LEDs that can be fabricated by a conventional process.

Embodiment 2

Hereinafter, a second preferred embodiment of a method for fabricating a semiconductor nanowire according to the present invention will be described with reference to FIGS. 11(a) through 11(d). In this preferred embodiment, nanowires with a heterostructure of GaAs and GaAsP (which will be referred to herein as "GaAs/GaAsP nanowires") are formed. These nanowires can be grown by VLS growth mechanism, which is a known method.

Figure 11:
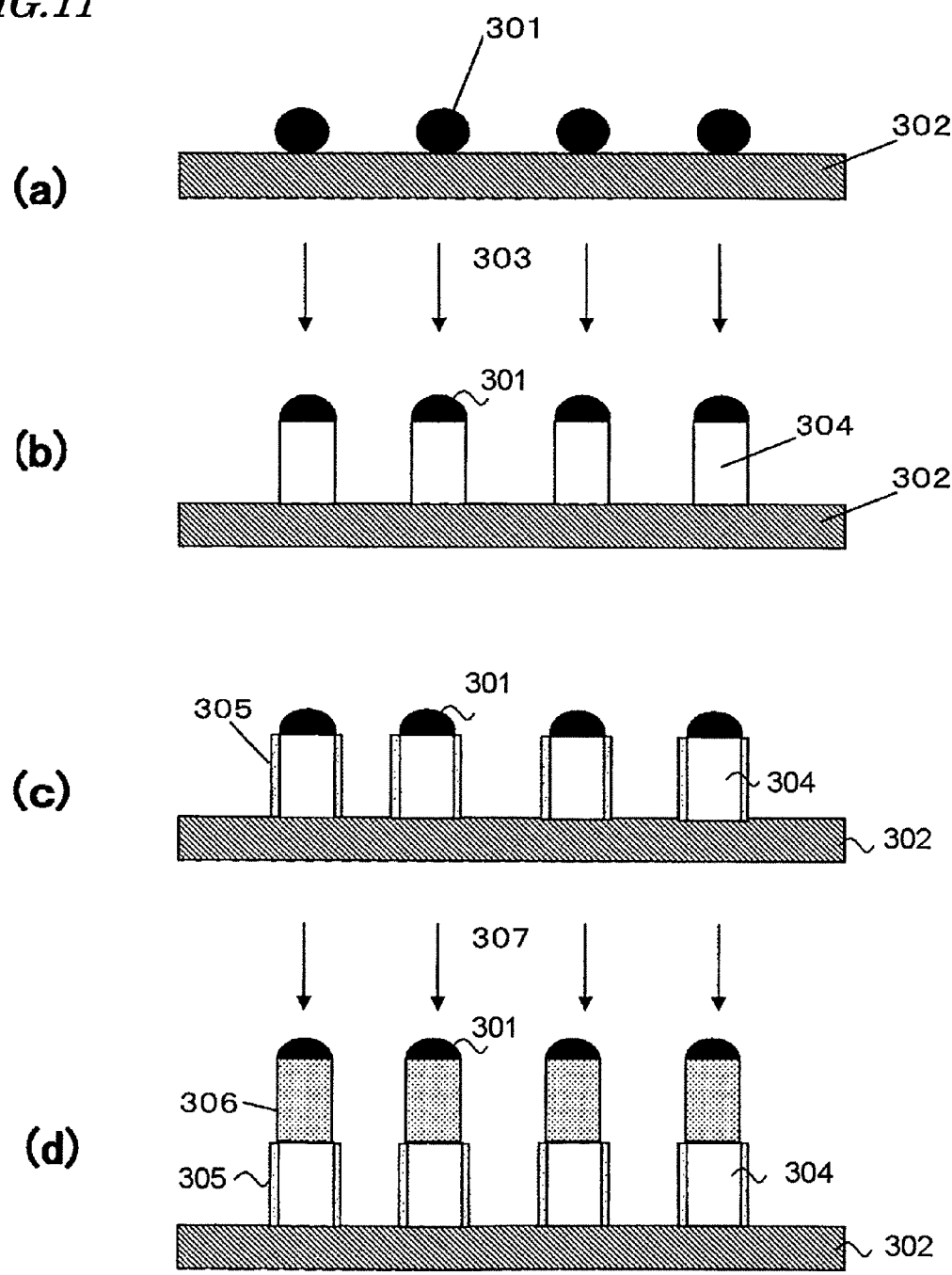

First, as shown in FIG. 11(a), Au particles 301 are put on an arbitrary substrate 302 by the method described above, for example.

Next, the substrate 302 with these Au particles 301 is loaded into the chamber of a CVD system, for example. Then, as shown in FIG. 11(b), a source gas 303, including a constituent element of GaAs nanowires, is introduced into the chamber and maintained at a predetermined pressure. And the substrate 302 is heated by a lamp or a heater, for example, and maintained at an arbitrary temperature, thereby growing GaAs nanowires 304. The GaAs source gas 303 may include triethylgallium (TEG) as a Ga source gas and arsine ($AsH_3$) as an As source gas.

Next, as shown in FIG. 11(c), a protective coating 305 is formed on the sidewall of the GaAs nanowires 304. The protective coating 305 may be formed by introducing a gas into the chamber and depositing a film or by performing a sputtering process or an evaporation process, for example. Also, the protective coating 304 is preferably made of a material that would be etched away in at least three times as high an etch rate as the GaAs nanowires 304 and GaAsP nanowires 306 (see FIG. 11(d)) when exposed to the same arbitrary etchant. Specifically, the protective coating 305 may be made of a silicon dioxide film or a silicon nitride film.

Subsequently, as shown in FIG. 11(d), a GaAsP source gas 307, including a constituent element of GaAsP, is introduced into the chamber and maintained at a predetermined pressure and a predetermined temperature, thereby growing GaAsP nanowires 306. The GaAsP source gas 306 may include TEG as a Ga source gas, $AsH_3$ as an As source gas, and phosphine ($PH_3$) as a P source gas.

The GaAs nanowires 304 and the GaAsP nanowires 306 may have a length of approximately 1 µm to approximately 100 µm and a diameter of approximately 2 nm to approximately 1 µm, for example.

Just like the protective coating 208 of the first preferred embodiment described above, the material of the protective coating 305 may be determined so that the material deposited on the protective coating 305 will never grow while the GaAsP nanowires 306 are growing. And the protective coating 305 is preferably thick enough to prevent the constituent element of the GaAsP nanowires 306 from diffusing through the protective coating 305 to reach the surface of the GaAs nanowires 304 while the GaAsP nanowires 306 are growing.

According to the nanowire manufacturing process of this preferred embodiment, while the GaAsP nanowires 306 are growing, the sidewall of the GaAs nanowires is covered with a protective coating and therefore is never exposed to a atmosphere including P. That is why even after the GaAsP nanowires 306 have grown, the GaAs nanowires 304 can still maintain the same composition and the same surface state. As a result, a nanowire structure can be obtained just as designed.

Embodiment 3

Hereinafter, a semiconductor device will be described as a third specific preferred embodiment of the present invention. The semiconductor device of this preferred embodiment is a transistor including the Si nanowires of the first preferred embodiment (which will be referred to herein as "profile Si nanowires").

FIG. 12 is a perspective view illustrating a transistor including the profile Si nanowires (which will be referred to herein as a "nanowire transistor") as a third preferred embodiment of the present invention. FIG. 13(a) is a top view of the nanowire transistor shown in FIG. 12 and FIG. 13(b) is a cross-sectional view as viewed on the plane C-C shown in FIG. 13(a).

In each of the profile Si nanowires 406 of this preferred embodiment, the p-type doped regions 407 are doped with a Group III element such as B at a dose of approximately $1 \times 10^{18}$ atoms/$cm^3$ to approximately $1 \times 10^{20}$ atoms/$cm^3$, while the non-doped region 408 includes a Group III element such as B in a concentration of less than $1 \times 10^{18}$ atoms/$cm^3$. Optionally, the p-type doped regions 407 may be an alloy of Si and an arbitrary metal such as nickel silicide or titanium silicide.

The nanowire transistor 400 includes source/drain electrodes 404 and 405 that contact with the profile Si nanowires 406, and their supporting substrate 401. As the p-type doped regions 407 of the profile Si nanowires 406 contact with the source/drain electrodes 404 and 405, good electrical contact can be maintained between the profile Si nanowires 406 and the source/drain electrodes 404 and 405.

Also arranged on the principal surface of the substrate 401 are a gate electrode 402 and a gate insulating film 403 that electrically insulates the gate electrode 402 from the profile Si nanowires 406. That is to say, this transistor has a bottom-gate type transistor structure in which the profile Si nanowires 406 are arranged on the gate insulating film 403.

When a bias voltage is applied to the gate electrode 402, the electrical conductivity of the channel region of the profile Si nanowires 406 is controlled by way of the gate insulating film 403.

In this case, the substrate 401 may be a plastic substrate made of polyimide or an aromatic ester, a glass substrate, or a sapphire substrate, for instance. Examples of preferred materials for the gate electrode 402 and the source/drain electrodes 404 and 405 include metals such as titanium, gold, aluminum and nickel, conductive polymers, polysilicon, and alloys of a semiconductor material and a metal such as titanium silicide.

The transistor of this preferred embodiment is a bottom-gate type. However, the present invention is in no way limited to this specific preferred embodiment. Alternatively, the transistor of the present invention may also be a top-gate type because the same effect will also be achieved in that case.

Also, in this preferred embodiment, the profile Si nanowires 406 have the p-i-p structure. If an n-channel transistor should be fabricated, however, nanowires with an n-i-n structure may be used.

In the nanowire transistor of this preferred embodiment, there is a doped layer in the areas where the nanowires 406 and the source/drain electrodes 404 and 405 contact with each other, and therefore, the contact resistance can be reduced on a substrate with low thermal resistance. That is why by using such nanowires with the profile structure, a transistor with high current drivability, of which the contact properties are improved between its electrodes and a semiconductor layer, is realized without affecting the operation of the device.

Hereinafter, it will be described how to fabricate the nanowire transistor of this preferred embodiment.

FIGS. 14(a) through 14(c) illustrate an exemplary series of manufacturing process steps to fabricate the nanowire transistor of the third preferred embodiment.

In the manufacturing process of this preferred embodiment, the nanowires may be fabricated basically in the same way as in the first preferred embodiment described above. The p-type doped regions 407 and the non-doped region 408 may be grown to any arbitrary lengths by adjusting their growth process times arbitrarily. Specifically, the lengths of the nanowires may be defined in the following manner. The length of the non-doped region 408 may be approximately equal to that of the gate electrode 402 as measured in the channel direction. On the other hand, the length of the p-type doped regions 407 may be defined so that the contact resistance between the p-type doped regions 407 and the source/drain electrodes 404 and 405 can be reduced. For example, if the transistor 400 has a channel length of 5 μm and if the p-type doped regions have a B concentration of approximately $1 \times 10^{20}$ atoms/cm$^3$, then the p-type doped regions 407 and the non-doped region 408 may have a length of 5 μm each.

Also, it is effective to conduct a heat treatment in order to activate an inactive dopant and repair crystal defects after nanowires have been formed by the method of the first preferred embodiment. The heat treatment may be carried out at a temperature of approximately 900° to approximately 1,100° for about 10 seconds to about 5 minutes in an inert atmosphere such as nitrogen atmosphere.

Alternatively, it is no less effective to conduct a heat treatment in a hydrogen atmosphere in order to reduce the channel interface levels (at the interface between Si and SiO$_2$) after the nanowires have been formed by the method of the first preferred embodiment. In that case, the heat treatment may be carried out at a temperature of approximately 400° to approximately 500° for about 10 minutes to about 30 minutes.

Optionally, after the nanowires have been formed by the method of the first preferred embodiment, an insulating film that functions as at least a part of the gate insulating film 403 may be formed on the sidewall of the nanowires. Such an insulating film may be formed by performing a thermal oxidation process in an oxygen atmosphere.

The nanowire transistor of this preferred embodiment may be fabricated by a known method. Hereinafter, an exemplary method for fabricating the nanowire transistor will be described.

First, as shown in FIG. 14(a), a gate electrode 402 and a gate insulating film 403 are formed on the principal surface of a substrate 401. The gate electrode 402 may be formed by depositing a gate metal by sputtering or evaporation process in a known thin film deposition system and then patterning the gate metal by photolithographic and etching processes. The gate insulating film 403 may be formed by spin-coating the substrate with a precursor of a gate insulating film material and then by removing the solvent and annealing the substrate. Alternatively, the gate insulating film 403 may also be deposited by CVD process, sputtering process or evaporation process.

Next, as shown in FIG. 14(b), profile Si nanowires 406 are arranged on the substrate in the following manner, for example. Specifically, the profile Si nanowires 406 are stripped from their growing substrate and then dispersed in a solution to obtain a dispersant in which those profile Si nanowires 406 are dispersed. Examples of methods of stripping the nanowires from the growing substrate include mechanically stripping the nanowires by subjecting the substrate to ultrasonic vibrations and stripping the nanowires by thinly etching the surface of their growing substrate. As a solvent for the dispersant, an aqueous solution, an organic solvent or a mixture of water and an organic solvent may be used. Examples of organic solvents include alcohols such as ethanol, propanol, pentanol, hexanol, and ethyleneglycol, esters such as ethyleneglycolmonomethylether, ketones such as methylethylketone, alkanes such as hexane and octane, and solvents such as tetrahydrofuran and chloroform. As a mixture of water and an organic solvent, a mixture of water and alcohol and a mixture of water and tetrahydrofuran may be used. Next, the profile Si nanowires 406 may be arranged in the following manner. For example, a mold with a plurality of grooves in a desired shape is brought into close contact with the area where the nanowires 406 should be arranged, and the dispersant in which the nanowires are dispersed is made to flow through those grooves (which is called a "flow process"). If such a flow process is adopted, the locations and shapes of the nanowires can be controlled with the shape of the mold, and the direction of the nanowires can be defined by the flow of the liquid. That is to say, the nanowires can be aligned in the molding direction.

Thereafter, as shown in FIG. 14(c), source/drain electrodes 404 and 405 are formed. Specifically, after a photoresist pattern has been defined by photolithographic process, a source/drain electrode material is deposited thereon by sputtering process and then lifted off from the photoresist pattern.

As described above, by using nanowires with the p-i-p structure for a transistor, there is no need to implant a dopant into the device forming substrate or subject it to a heat treatment. As a result, a high-performance transistor can be fabricated by a conventional process with the variation reduced. On top of that, as there is no need to implant a dopant into a substrate or subject it to a heat treatment, the manufacturing process can be free from restrictions on the area and thermal resistance of the substrate used.

Hereinafter, a display that uses an organic electroluminescence (organic EL) device will be described as an exemplary electronic device including the transistor of this preferred embodiment.

FIG. 15 schematically illustrates the configuration of such a display. In the display shown in FIG. 15, a number of pixels 415 are arranged in matrix on a substrate 410. Each of those pixels 415 includes an organic EL device, around which a circuit including a TFT is arranged. The organic EL device is controlled by the circuit including the TFT. Also arranged on the substrate 410 are X scan electrodes 413, Y scan electrodes 414, an X driver 411 and a Y driver 412 to control the TFTs.

FIG. 16 illustrates the circuit to be arranged around each pixel. In this case, each pixel 415 is controlled by a switching transistor 416 and a driver transistor 417. The Y driver 412 (shown in FIG. 15) applies a voltage to the source electrode of the switching transistor 416 by way of one of the Y scan electrodes 414. The drain electrode of the switching transistor 416 is electrically connected to the gate electrode of the driver transistor 417. The drain electrode of the driver transistor 417 is electrically connected to a pixel electrode (not shown) that is arranged at the bottom of the pixel. Also, a voltage to make the pixel produce electroluminescence is applied to the source electrode of the driver transistor 417.

On the other hand, an image signal voltage is applied to the gate electrode of the switching transistor 416 from the X driver 411 by way of one of the X scan electrodes 413. on receiving the image signal voltage, the switching transistor applies a voltage to the gate electrode of the driver transistor 417. As a result, a voltage is applied from the driver transistor to the pixel electrode. Although not shown, a transparent electrode is actually arranged over the pixel. And when a voltage is applied between the pixel electrode and the transparent electrode, the pixel produces electroluminescence.

Embodiment 4

Hereinafter, a nanowire light-emitting diode (LED) including the semiconductor nanowires of the present invention will be described as a fourth specific preferred embodiment of the present invention. The light-emitting diode of this preferred embodiment has a light-emitting area in which a number of heterostructure nanowires, each having two regions with mutually different compositions, are arranged. The hetero nanowires of this preferred embodiment may consist of GaAs and GaAsP as already described for the second preferred embodiment.

FIG. 17(a) is a cross-sectional view illustrating the structure of a GaAs/GaAsP hetero nanowire 500 according to this preferred embodiment, and FIG. 17(b) is a perspective view illustrating a nanowire light-emitting diode 503 that uses the GaAs/GaAsP hetero nanowires 500. The structure of this nanowire light-emitting diode 503 will be described.

The GaAs/GaAsP hetero nanowire 500 shown in FIG. 17(a) has a heterostructure in which a GaAs layer 501 and a GaAsP layer 502 have been connected together.

The nanowire light-emitting diode 503 shown in FIG. 17(b) includes first and second electrodes 505 and 506 that contact with the GaAs/GaAsP hetero nanowires 500 and their supporting substrate 504. The GaAs/GaAsP hetero nanowires 500 make electrical contact with the first and second electrodes 505 and 506.

Each of the first and second electrodes 505 and 506 functions as either an anode or a cathode. When a voltage is applied to these electrodes, the anode and the cathode will inject holes and electrons, respectively, into the GaAs/GaAsP hetero nanowires 500. Those carriers injected will recombine with each other at the heterojunction between the GaAs layer 501 and GaAsP layer, thereby producing luminescence.

The substrate 504 shown in FIG. 17(b) may be a plastic substrate made of polyimide or an aromatic ester, a glass substrate, or a sapphire substrate, or any of various other substrates. Examples of preferred materials for the first and second electrodes 505 and 506 include metals such as titanium, gold, aluminum and nickel, conductive polymers, polysilicon, and alloys of a semiconductor material and a metal such as titanium silicide.

The nanowire light-emitting diode of this preferred embodiment includes nanowires with low defect density, thus realizing a light-emitting device with high luminous efficacy and a long life.

INDUSTRIAL APPLICABILITY

A method for fabricating a nanowire according to the present invention contributes to making nanowires with a controlled structure by performing a simple manufacturing process, and therefore, can be used effectively to mass-produce such nanowires. The nanowires of the present invention are applicable for use in various electronic devices and micro devices including transistors and memories.

The invention claimed is:

1. A method for fabricating a semiconductor nanowire that has first and second regions, the method comprising:
    putting a catalyst particle on a substrate;
    growing the first region from the catalyst particle with a vapor-liquid-solid phase (VLS) grower;
    forming a protective coating on a sidewall of the first region; and
    growing the second region extending from the first region with the VLS grower.

2. The method of claim 1, wherein a conductivity type of the first region is one of N and P types and a conductivity type of the second region is an other of N and P types.

3. The method of claim 1, wherein a conductivity type of the first region is the same as a conductivity type of the second region, and wherein an electrical conductivity of the second region is lower than an electrical conductivity of the first region.

4. The method of claim 1, wherein the catalyst particle comprises one of a metal and an alloy of a metal and further comprises a semiconductor.

5. The method of claim 1, wherein the second region comprises a semiconductor material doped with a dopant element.

6. The method of claim 5, wherein at a growth temperature of the second region, a solid solubility of the dopant element with respect to the catalyst particle is at most $1 \times 10^{19}$ atoms/$cm^3$.

7. The method of claim 6, wherein the first and second regions comprise a semiconductor material that includes at least one element selected from a group consisting of Si, Ge and C.

8. The method of claim 5, wherein the dopant element comprises at least one element selected from a group consisting of B, P, As and Sb.

9. The method of claim 1, wherein, when growing the second region, a constituent element of the second region diffuses through the protective coating and does not diffuse to the first region.

10. The method of claim 9, wherein the protective coating includes at least one film selected from a group consisting of a silicon dioxide film, a silicon oxynitride film and a silicon nitride film.

11. The method of claim 1, wherein a bandgap of the first region is different from a bandgap of the second region.

12. The method of claim 11, wherein the second region comprises at least two different elements and wherein at a growth temperature of the second region, a solid solubility of at least one of the at least two different elements of the second region with respect to the catalyst particle is at most $1 \times 10^{19}$ atoms/$cm^3$.

13. The method of claim 1, wherein the protective coating is formed by thermally oxidizing the first region.

14. A semiconductor nanowire comprising:
    a first region including a dopant in a concentration of at least $1 \times 10^{19}$ atoms/$cm^3$;
    a second region, arranged continuously with the first region in a longitudinal direction thereof and including one of a first dopant in a concentration of at most $1 \times 10^{18}$ atoms/$cm^3$ and no dopant; and
    a third region arranged continuously with the second region in the longitudinal direction thereof and including a second dopant in a concentration of at least $1 \times 10^{19}$ atoms/$cm^3$.

15. A semiconductor device with the semiconductor nanowire of claim 14, comprising:
    a source electrode connected to the first region of the semiconductor nanowire;
    a drain electrode connected to the third region of the semiconductor nanowire;
    a gate electrode facing the second region of the semiconductor nanowire; and a gate insulating film arranged between the second region and the gate electrode.

16. A semiconductor nanowire, comprising:
- a first region including a dopant;
- a second region having a lower dopant concentration than the first region and arranged continuously with the first region in a longitudinal direction thereof;
- a third region, which has having a higher dopant concentration than the second region and arranged continuously with the second region in the longitudinal direction thereof;
- a first sidewall arranged on a side surface of the first region and including a first polycrystalline material; and
- a second sidewall arranged on a side surface of the third region and including a second polycrystalline material,
wherein the first sidewall and the second sidewall are not arranged on a side surface of the second region.

17. The semiconductor nanowire of claim 16, wherein a thickness of the first sidewall and a thickness of the second sidewall one of increase and decrease in a direction extending toward the second region.

18. A semiconductor device with the semiconductor nanowire of claim 16, the device comprising:
- a source electrode connected to the first region of the semiconductor nanowire;
- a drain electrode connected to the third region of the semiconductor nanowire;
- a gate electrode facing the second region of the semiconductor nanowire; and
- a gate insulating film arranged between the second region and the gate electrode.

* * * * *